(12) United States Patent
Ramirez et al.

(10) Patent No.: US 9,983,248 B1
(45) Date of Patent: May 29, 2018

(54) INCREMENTAL DATA CENTER INFRASTRUCTURE COMMISSIONING

(71) Applicant: Amazon Technologies, Inc., Seattle, WA (US)

(72) Inventors: Antonio William Vasquez Ramirez, Snohomish, WA (US); Faran Harold Kaplan, Seattle, WA (US); Robert David Wilding, Seattle, WA (US); Richard Chadwick Towner, Front Royal, VA (US)

(73) Assignee: Amazon Technologies, Inc., Seattle, WA (US)

( * ) Notice: Subject to any disclaimer, the term of this patent is extended or adjusted under 35 U.S.C. 154(b) by 384 days.

(21) Appl. No.: 14/663,138

(22) Filed: Mar. 19, 2015

(51) Int. Cl.
   *G01R 31/02* (2006.01)
(52) U.S. Cl.
   CPC .................. *G01R 31/021* (2013.01)
(58) Field of Classification Search
   CPC ........................................... G01R 31/021
   See application file for complete search history.

(56) References Cited

U.S. PATENT DOCUMENTS

2015/0129301 A1* 5/2015 Bailey .................. G06F 1/189
174/70 B

OTHER PUBLICATIONS

Rassmussen et al., Comparing Data Center Power Distribution Architectures, White Paper 129, Rev. 3, Schneider Electric White Papers, 2013.*
Koty, Commissioning with Load Banks, Dec. 2014, available at http://www.pducables.com/kens-korners/2014/12/commissioning-with-load-banks/.*
Michael Rosenberg, "Commissioning the Data Center the Intergrated Systems Test", Glenmount Global Solutions, 2012, pp. 1-19.
Paul Marcoux, "Data Center Projects: Commissioning", Schneider Electric, 2011, pp. 1-17.

* cited by examiner

*Primary Examiner* — Daniel Miller
(74) *Attorney, Agent, or Firm* — Robert C. Kowert; Meyertons, Hood, Kivlin, Kowert & Goetzel, P.C.

(57) ABSTRACT

Power distribution infrastructure is incrementally deployed and commissioned to enable incremental infrastructure deployment to support incremental changes in computing capacity in a data center, where interaction between infrastructure being commissioned and installed computer systems is mitigated. Power distribution system commissioning includes coupling busway stub segments to a downstream end of the power distribution system and operating load banks, coupled to each busway stub segment, to simulate the power distribution system supporting electrical power consumption by multiple sets of computer systems through the busway stub segments. A power busway, installed via coupling busway segments to a busway stub segment, is commissioned while electrically isolated from the power distribution system via coupling a load bank and secondary power distribution system to opposite ends of the busway and operating the load bank to simulate the power busway supporting electrical power consumption by a set of computer systems, via reserve power, throughout the busway length.

18 Claims, 8 Drawing Sheets

INCREMENTAL DATA CENTER INFRASTRUCTURE COMMISSIONING

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many computing racks, which may include server racks. Each computing rack, in turn, may include many computer systems, servers, associated computer equipment, etc.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility.

In some cases, where some or all infrastructure initially installed in a data center is based on expected support requirements of server racks which are expected to be installed in the data center, the server racks which are actually installed in a data center may differ in support requirements from the server racks upon which the infrastructure for a data center is originally designed. In addition, the support requirements of installed server racks may vary from rack to rack. Infrastructure which is designed based on expected support requirements of installed server racks may be at least partially restricted in supporting server racks that are actually installed.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), install cabling infrastructure, install racks, structural support infrastructure, electrical distribution infrastructure, and cooling infrastructure, etc., to support changes in computing capacity. Additional time and resources are typically needed to conduct inspections and obtain certifications and approvals, such as for electrical and HVAC systems. Changes in computing capacity may result in changes in infrastructure support required to support the changed computing capacity. Installing infrastructure equipment, modifying infrastructure equipment, etc. may be time consuming and expensive, if even feasible. For example, where an installed server rack in a portion of a data center is replaced with another server rack, where the new server rack has substantially greater infrastructure support requirements, modifying the infrastructure which supported the previously-installed server rack may be difficult, particularly where the infrastructure to be modified lacks sufficient excess capacity to provide the needed support to the newly-installed server rack.

Figure 1:
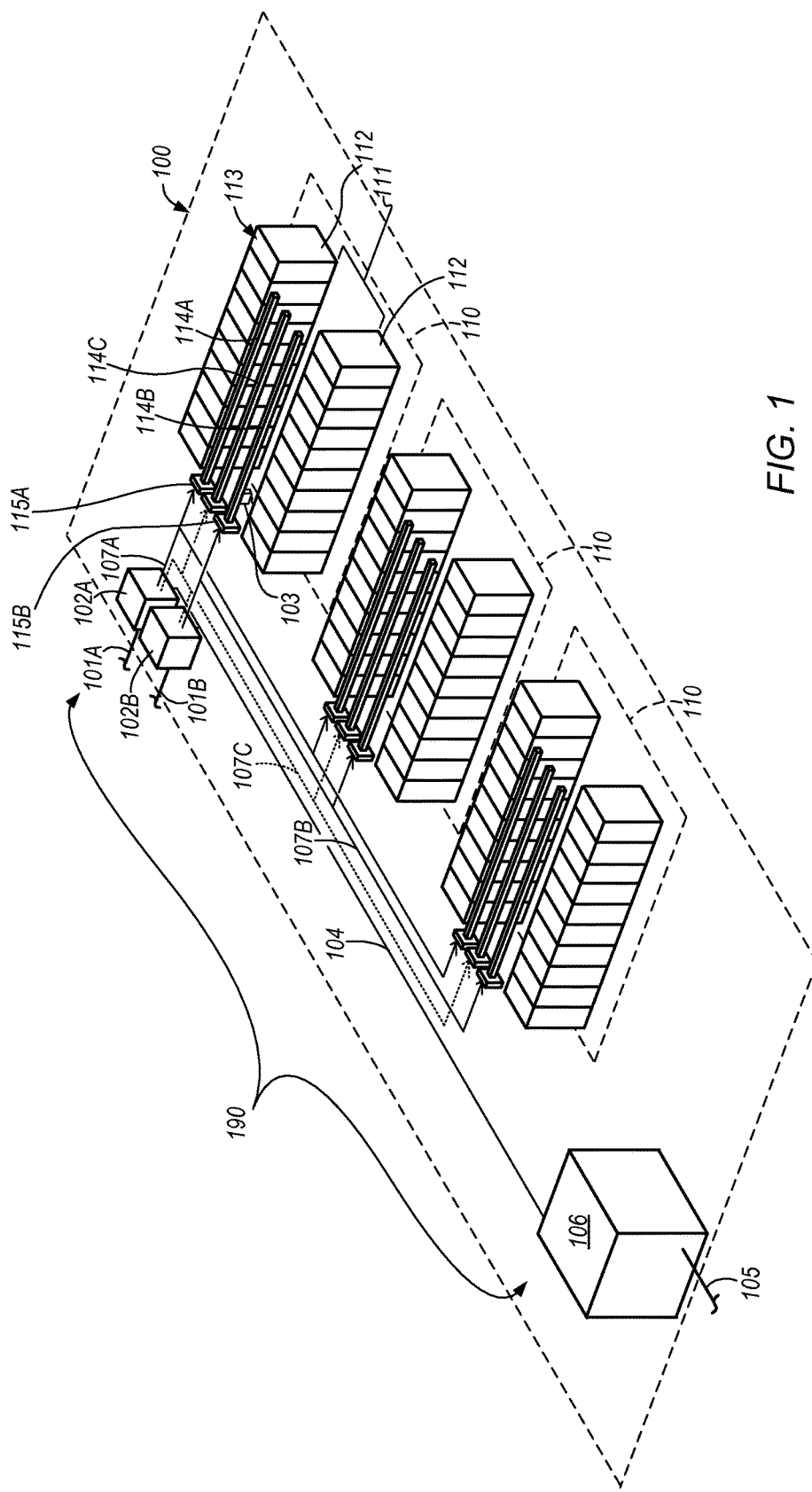
FIG. 1 is a schematic illustrating a perspective view of a data center including a set of rack computer systems and a power distribution infrastructure configured to support electrical power consumption by the rack computer systems, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of installing a power distribution infrastructure in a data center are disclosed.

According to one embodiment, a method for commissioning a power distribution infrastructure in a data center includes installing a power distribution system in the data center, installing a set of busway disconnect switches in the data center, installing a set of busway stub segments in the data center, verifying that the power distribution system is configured to support electrical power consumption by a plurality of sets of rack computer systems, installing at least one power busway in at least one portion of the data center, verifying that the at least one power busway is configured to support electrical power consumption by at least one set of rack computer systems, and installing the at least one set of rack computer systems in the data center. The power distribution system comprises a set of power distribution components configured to supply electrical power from at least one of a utility power feed or a generator power feed. Installing a set of busway disconnect switches in the data center comprises electrically coupling the busway disconnect switches in parallel to a downstream end of the power distribution system. Installing a set of busway stub segments in the data center comprises coupling the separate busway stub segments to separate busway disconnect switches. Verifying that the power distribution system is configured to support electrical power consumption by a plurality of sets of rack computer systems comprises electrically coupling separate load banks, wherein each separate load bank is configured to simulate electrical power consumption by a separate set of rack computer systems, to a separate busway stub segment of the set of busway stub segments; and operating each of the separate load banks, such that electrical power support of electrical power consumption by the plurality of sets of rack computer system by the power distribution system is simulated. Installing at least one power busway in at least one portion of the data center comprises electrically isolating a particular busway segment from the power distribution system, via operation of a busway disconnect switch coupled to the particular busway segment, and coupling at least one additional busway segment to a particular busway stub segment, such that the at least one power busway comprises, at a proximate end, the busway stub segment and, at a distal end, at least one additional busway segment. Verifying that the at least one power busway is configured to support electrical power consumption by at least one set of rack computer systems comprises electrically coupling at least one load bank, to the proximate end of the at least one power busway, electrically coupling a secondary power distribution system to the distal end of the at least one power busway, and operating the at least one load bank, such that electrical power support of electrical power consumption by the at least one set of rack computer system, through an entire length of the at least one power busway is simulated. Installing the at least one set of rack computer systems in the data center comprises electrically decoupling the at least one power busway from the at least one load bank, electrically decoupling the at least one power busway from the secondary power distribution system, electrically coupling the at least one set of rack computer systems to the at least one power busway, and electrically coupling the at least one power busway to the power distribution system.

According to one embodiment, a method includes commissioning a power busway, coupled to a power distribution system, which includes verifying that a power distribution system is configured to support electrical power consumption by a plurality of sets of electrical loads. The commissioning includes electrically coupling a set of busway stub segments in parallel to a downstream end of the power distribution system, electrically coupling separate load banks, wherein each separate load bank is configured to simulate electrical power consumption by a separate set of electrical loads, to separate busway stub segments, and operating each of the separate load banks, such that electrical power support by the power distribution system, of electrical power consumption by the plurality of sets of rack computer system, is simulated.

According to one embodiment, a method includes commissioning a power busway, coupled to a power distribution system, which includes verifying that the power busway is configured to support electrical power consumption from a power distribution system by a set of electrical loads. The commissioning includes electrically isolating the power busway from the power distribution system, electrically coupling the power busway, at a particular end, to a reserve power distribution system, electrically coupling the power busway, at an opposite end from the particular end, to a load bank which is configured to simulate electrical power consumption by the set of electrical loads of the power busway, and operating the load bank, such that electrical power support, by the power busway, of electrical power consumption by the set of electrical loads, through an entire length of the power busway, is simulated via reserve power received from the reserve power distribution system.

As used herein, "computer room" means a room of a building in which computer systems, such as rack-mounted servers, are operated.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a secondary power distribution system may provide secondary power support to an electrical load by providing a secondary power feed that can be selectively routed to the load by a switching device that is downstream of the secondary power distribution system and upstream of the load, where the switching device may selectively route the secondary power feed or a primary power feed to the load based at least in part upon one or more conditions associated with the primary power feed. Where a power distribution system, one or more power distribution components, etc. are configured to support a certain maximum amount of electrical power consumption, the maximum amount of electrical power consumption is referred to herein as the power support capacity of the power distribution system, one or more power distribution components, etc.

As used herein, "electrical load" includes a device, component, etc. which consumes electrical power. Where a device consumes electrical power to perform one or more functions, including performing computing operations, the device is referred to herein as a "live load". Where a device generates an amount of electrical power consumption which corresponds to electrical power consumption by one or more live loads, the device is referred to herein as a "test load". Where a power distribution system supplies electrical power which is consumed by one or more live loads, test loads, some combination thereof, etc., the power distribution system is referred to as "supporting", or "providing electrical power support to", the one or more live loads, test loads, some combination thereof, etc. The electrical power consumption, by an electrical load, can itself be referred to as a load.

As used herein, "power distribution unit", also referred to herein as a "PDU", means any device, module, component, or combination thereof, which can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, "primary power" means any power that can be supplied to an electrical load, for example, during normal operating conditions. A power distribution system (also referred to herein as a "power system") that distributes primary power may be referred to as a primary power system.

As used herein, "secondary power", which can include one or more of "reserve power", "backup power", etc., means power that can be supplied to an electrical load upon the failure of, or as a substitute for, primary power to the load. A power distribution system (also referred to herein as a "power system") that distributes secondary power may be referred to as a secondary power system.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

FIG. 1 is a schematic illustrating a perspective view of a data center including a set of rack computer systems and a power distribution infrastructure configured to support electrical power consumption by the rack computer systems, according to some embodiments.

Data center 100 includes multiple aisle spaces 110, also referred to herein as "spaces", which each provide computing capacity for the data center 100. In some embodiments, each separate space 110 is a separate computer room within data center 100. Each aisle space 110 includes an aisle 111 and two rows 112 of rack computer systems 113, also referred to herein as "sets" of rack computer systems, which extend along the length of the aisle 111 along opposite side ends of the aisle 111. Each rack computer system 113 can provide at least a portion of computing capacity of the aisle space 110 by performing computing operations. In the illustrated embodiment, each aisle space 110 in data center 100 is parallel, such that the respective aisles 111 of each of the aisle spaces 110 extend in parallel with each other along their respective lengths between opposite ends of the aisles 111. Furthermore, the rows 112 of rack computer systems 113 in the parallel aisle spaces 110 extend in parallel with each other.

Data center 100 includes a power distribution infrastructure 190 which provides power support to the various rack computer systems 113 in the data center 100. Power distribution infrastructure 190 includes primary power distribution systems 102A-B and secondary power distribution system 106. Each power distribution system 102A-B, 106 can include various separate sets of power distribution components, including a utility transformer, generator, uninterruptible power supply ("UPS"), power distribution unit ("PDU"), power distribution panel board (PDP), utility distribution board, critical distribution board, etc. Each separate power distribution system receives utility power from a separate utility power source.

Each aisle space 110 in data center 100 includes a set of power busways 114 which can provide power support to rack computer systems 113 in the aisle space. A set of power busways can include separate power busways which receive power from separate power distribution systems and are electrically coupled to one or more components in the aisle space, so that the busways can distribute power to one or more rack computer systems 113 via the coupled components. In the illustrated embodiment, for example, aisle space 110 includes power busways 114A-B. The busways 114 extend through the aisle space 110, along the length of the aisle 111 between opposite ends of the aisle 111. Each busway 114A-B includes at least one feed box 115A-B which receives power which is carried by the respective busway and distributed to electrically coupled components in the aisle space 110 to provide power support to at least some of the rack computer systems 113 in the aisle space.

In some embodiments, separate portions of rack computer systems in one or more aisle spaces receive primary power support from separate busways which receive power from separate primary power distribution systems. For example, in the illustrated embodiment, each aisle space 110 includes power busways 114A and 114B which extend along the aisle 111 of the aisle space 110 and respectively receive primary power from a separate primary power distribution system 102A-B. In some embodiments, busway 114A is electrically coupled to one of the rows 112 of rack computer systems 113 on one side end of aisle 111, and busway 114B is electrically coupled another row 112 of rack computer systems 113 on the other side end of aisle 111. In some embodiments, a single primary power busway 114 extends through an aisle 111 and provides primary power support to each of the rack computer systems 113 in the aisle space 110 by electrically coupling with each of the rack computer systems 113. Each of the primary power busways 114A-B includes a separate feed box 115A-B at one end of the respective primary power busway. The respective feed boxes 115A-B are each electrically coupled to a separate primary power system 102A-B via respective separate power transmission lines 107A-B. The separate instances of power transmission lines 107A-B can each at least partially comprise one or more busways, bus ducts, power cables, etc.

The feed boxes 115A-B may be located at a particular end of each of the primary power busways 114A-B that is proximate to a particular end of aisle 111. In the illustrated embodiment, for example, feed boxes 115A-B are located at respective ends of busways 114A-B which are proximate to an end of aisle 111 which is proximate to primary power systems 102A-B. In some embodiments, one or more of the feedboxes is coupled to a busway disconnect switch which is configured to selectively electrically couple or isolate a corresponding power busway relative to a respective power transmission line 107 instance.

Primary power distribution systems 102A-B each receive utility power from separate power sources 101A-B, respectively. Each primary power distribution system 102A-B can distribute primary power to various rack computer systems 113 in the aisle spaces 110 via power transmission lines 107A-B, respectively. Each primary power system can include various separate sets of power distribution components, including a utility transformer, generator, UPS, power distribution unit (PDU), etc.

Secondary power distribution system 106 receives power from a separate power source 105 and is electrically coupled to at least one power distribution component included in the primary power distribution systems 102A-B via one or more instances of power transmission lines 104. For example, the secondary power distribution system 106 can be electrically coupled to power distribution panelboards included in each of the systems 102A-B, where each panelboard included in a particular primary power distribution system 102 is configured to selectively switch the power distributed to the instance 107 of power transmission lines which are coupled with a set of power busways 114 between one of primary power, distributed from a set of primary power distribution components included in the system 102 which are upstream of the panelboard, or secondary power distributed from the secondary power distribution system 106 via the instances of power transmission lines 104.

In some embodiments, including the illustrated embodiment of FIG. 1, the secondary power distribution system 106 distributes secondary power to one or more power distribution panelboards, and primary and secondary power is distributed from the one or more power distribution panelboards to one or more separate power busways 114A-C in the various spaces 110 via separate lines 107A-C. A power distribution panelboard, in some embodiments, is included in one or more primary power distribution systems 102A-B. In the illustrated embodiment of FIG. 1, secondary power distribution system 106 is coupled, via instances of power transmission lines 104, to power distribution panelboards included in primary power distribution systems 102A-B, and where secondary power from the system 106 can be distributed from the power distribution panelboards in systems 102A-B to secondary power busways 114C, in each aisle space 110, which carry secondary power from the system 106 independently of primary power distributed from the primary power distribution systems 102A-B which distribute power to separate primary power busways 114A-B via separate instances of power transmission lines 107A-B. Where a switching assembly, including an ATS, is included in a space 110 and is configured to selectively distribute power to racks 113 in the space 110 from a separate one of secondary power distribution system 106 or a primary power distribution system 102A-B, the switching assembly can be electrically coupled to each of a secondary power busway 114C in the space 110 and at least one of the primary power busways 114A-B in the space, so that the switching assembly can selectively distribute power received from one of the secondary power busway 114C or a primary power busway 114A-B.

In some embodiments, a power distribution panelboard is separate from primary power distribution systems 102A-B, such that the various power systems 102A-B, 106 distribute power to one or more power distribution panelboards which are separate from the power distribution systems. For example, in the illustrated embodiment, elements 102A-B can be power distribution panelboards which each receive secondary power from system 106 via lines 104 and each receive primary power from a separate primary power distribution system via separate power transmission lines 101A-B, and where primary power is distributed from the panelboards via separate primary power transmission liens 107A-B and secondary power is distributed from one or more of the panelboards via one or more secondary power transmission lines 107C.

In some embodiments, the secondary power distribution system 106 is directly electrically coupled to secondary power busways 114C via one or more instances of power transmission lines 107C, independently of any power transmission lines 104 electrically coupling the secondary power distribution system 106 to one or more components of the primary power distribution systems 102A-B. Where system 106 is electrically coupled to the secondary power busways 114C in each space 110 via one or more instances of power transmission lines 107C, the one or more instances of power transmission lines 107C can comprise one or more busways, bus ducts, power cables, some combination thereof, etc.

In some embodiments, the power distribution infrastructure 190 is installed incrementally in data center 100. The incremental installation can correspond with incremental installation of rack computer systems 113 in the various spaces 110 of data center 100, so that installation of various equipment in the power distribution infrastructure 190, where such equipment can be referred to as power distribution infrastructure components, is postponed until such equipment is required to be installed to support electrical power consumption by one or more rack computer systems 113 in the data center. As a result, capital expenditure on power distribution infrastructure equipment is postponed until required, thereby mitigating resource waste which can result from installing equipment before it is needed such that the installed equipment remains installed but unused for a period of time.

For example, where data center 100 is initially constructed, and the number of rack computer systems 113 to be initially installed can be installed in a single space 110, a primary power distribution system 102, instance of power transmission lines 107, and a busway 114 in space 110 can be installed, so that electrical power support can be provided to the rack computer systems 113 installed in the space. A secondary power distribution system 106, as well as additional primary power distribution systems 102, power transmission lines 107, 104, and busways 114 can be installed concurrently. As the computing capacity requirement for the data center 100 increases over time, additional rack computer systems 113 can be installed in the initial space 110 to provide additional computing capacity until the available space in which the rack computer systems 113 can be installed in the initial space 110 is exhausted, at which point at least one additional busway 114 is installed in another space 110, and the additional busway 114 coupled to a primary power distribution system 102 via one or more instances of power transmission lines 107, so that rack computer systems 113 can be installed in the another space 110 and receive electrical power support from the additional busway 114.

In some embodiments, one or more busways 114 is comprised of a series of busway segments which are coupled in series. One of the busway segments comprising a power busway 114 can include a busway stub segment which is coupled to one or more power transmission lines 107A-B. The busway stub segment can be installed as part of installation of one or more primary power distribution systems 102A-B in the data center 100, where the busway stub segment provides a placeholder location in a given space 110, at which additional busway segments can be coupled to the primary power distribution segment, via serially coupling with the busway stub segment, to establish a power busway.

Figure 2:
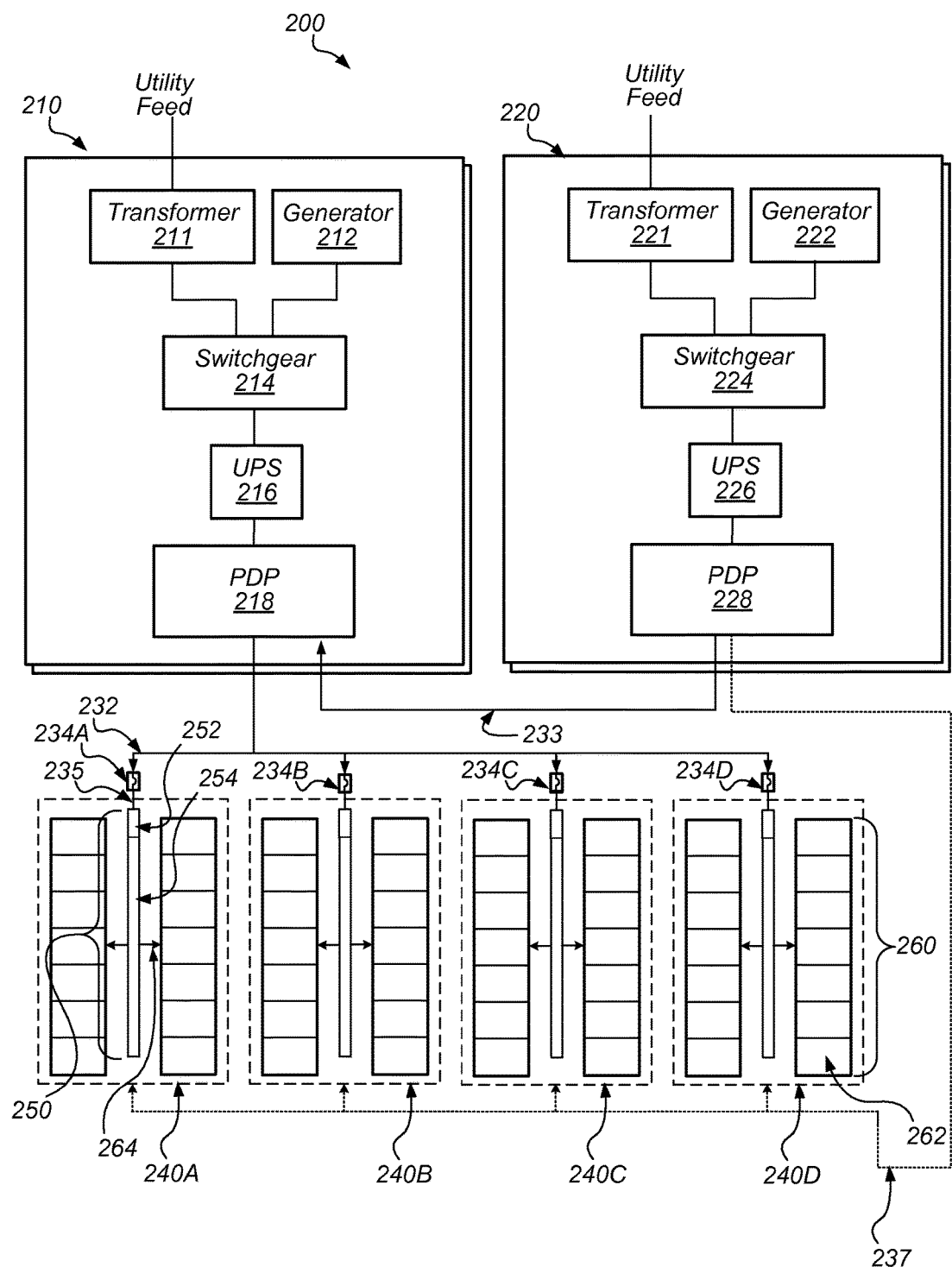
FIG. 2 is a schematic diagram illustrating a power distribution infrastructure configured to provide electrical power support to electrical loads at a site, according to some embodiments.

FIG. 2 is a schematic diagram illustrating a power distribution infrastructure configured to provide electrical power support to electrical loads at a site, according to some embodiments. The site can include the data center 100 shown in FIG. 1. The power distribution infrastructure 200 illustrated in FIG. 2 can be included in any of the embodiments of data centers included herein, including the data center 100 shown in FIG. 1.

Infrastructure 200 includes one or more primary power distribution systems 210 which are each configured to provide electrical power support to one or more sets 260 of electrical loads 262 included in a data center. As shown, each primary power distribution system 210 can include a transformer 211, which receives and steps down utility power received from a utility power feed, a generator 212 which can provide backup power, a switchgear 214 which can selectively switch between distributing power from either the transformer 211 or the generator 212, one or more uninterruptible power supplies (UPS) 216 which can receive power distributed by the switchgear 214 and can provide an uninterruptible supply of electrical power, and a power distribution panelboard which distributes electrical power from the primary power distribution system 210. It will be understood that a power distribution system can include additional components, different components, etc., including a critical distribution board, a utility switchboard, etc.

As shown, electrical power distributed from a panelboard 218 is distributed, in parallel via one or more instances 232 of power transmission lines, to a set of power busways 250A-D via busway disconnect switches 234A-D, where each busway 250 is located in a separate space 240A-D and is coupled, via one or more instances 254 of power transmission lines, to one or more sets 260 of electrical loads 262 which are located in the same space 240 as the respective busway 250. As a result, electrical power distributed from a primary power distribution system 210 can be distributed, in parallel, to multiple sets 260 of electrical loads 262 located in multiple separate spaces 240. In some embodiments, the electrical loads 262 include one or more rack computer systems, each set 260 comprises a row of rack computer systems, each space 240 comprises an aisle along which two rows 260 of rack computer systems 262 extend in parallel, where each space 240, and power distribution infrastructure 200, is located in a data center.

Each power busway 250 includes multiple busway segments, including a busway stub segment 252 and at least one additional busway segment 254 coupled to the busway stub segment 252 to establish the busway 250. A busway stub segment, of a given power busway 250, is located at a "proximate end" of the busway 250 and is coupled, via an instance 235 of power transmission lines, to a particular busway disconnect switch 234. A busway disconnect switch 234 can selectively electrically couple or isolate a given coupled transmission line 235 to a line 232, thereby selectively electrically coupling or isolating a given busway stub segment 252 coupled to the switch 234 via the given line 235, and thus the power busway 250 coupled to the given line 235, to the primary power distribution system 210.

Power distribution infrastructure 200 includes one or more secondary power distribution systems 220 which can provide secondary power support to the loads 262, which includes providing power support if power distribution from one or more portions of the primary power distribution systems 210 fails. As shown, a secondary power distribution system 220 can include one or more transformers 221, generators 222, switchgear 224, UPSs 226, power distribution panelboards (PDPs), etc. As shown, power distributed by a secondary power distribution system 220 can be distributed, via line 233, to a PDP 218 of a primary power distribution system 218, such that the PDP can distribute electrical power to the loads 262 from the primary power distribution system 210 or the secondary power distribution system 220. In some embodiments, a secondary power distribution system 220 is electrically coupled to the loads 262 via one or more separate instances of power transmission lines 234, such that secondary electrical power is provided to the loads 262 via a pathway separate from the pathway via which power from the primary power distribution system is distributed. For example, a switching device assembly can be included in a set 260, where the switching device assembly is coupled to the primary power distribution system 210 via line 264 and is coupled to the secondary power distribution system 220 via a separate line 237 and is further coupled to the loads 262 in the set 260 via one or more sets of branch circuits, so that the switching device assembly selectively distributes, to the loads via the branch circuits, power received from one of the lines 264 or 237.

In some embodiments, one or more of the primary power distribution systems 210, secondary power distribution systems 220, etc. can include one or more additional power distribution components, including one or more utility switchboards which is configured to selectively distribute power from one or more of a transformer or generator power output, one or more critical distribution panelboards, etc.

In some embodiments, the power distribution infrastructure 200 is installed incrementally to support incremental installation of electrical loads 262 in the various spaces 240. For example, electrical loads 262 can be initially installed in space 240A and not spaces 240B-D, such that at least some of the infrastructure 200 is not needed, initially, to support installed loads 262. For example, busways 250 extending through spaces 240B-D may not be required to provide power support to electrical loads 262 if electrical loads are not initially installed in spaces 240B-D. As a result, infrastructure 200 can be initially installed with sufficient infrastructure components to support the installed loads without installing excess infrastructure which would be needed to support presently-uninstalled loads in other spaces. As additional loads 262 are installed in additional spaces 240, infrastructure components needed to support the additional loads can be installed. As a result, capital expenditures associated with installing power distribution infrastructure can be deferred until needed to support installed loads, so that capital expenditure on infrastructure resources which may lie unused at a site can be mitigated.

In some embodiments, power distribution infrastructure components installed at a site are commissioned, individually and collectively, to verify that the components and the installed power distribution infrastructure are configured to support electrical power consumption by at least some loads which will be installed at the site. For example, where an installed set of power distribution infrastructure components in a power distribution infrastructure are collectively configured to support 3000 KWa of electrical power consumption by installed loads, which can be referred to as the power support capacity of the power distribution infrastructure, commissioning the power distribution infrastructure components can include verifying that the installed power distribution infrastructure components can actually support 3000 KWa of electrical power consumption. In another example, where a site is configured to support a set of loads which collectively consume 5000 KWa of electrical power, referred to herein as a total electrical power consumption of the site, commissioning a power distribution infrastructure installed at the site can include verifying that the power distribution infrastructure can actually support the total electrical power consumption of the site.

Commissioning at least some of a power distribution infrastructure can include performing various tests on various portions of the power distribution infrastructure, including testing some or all of an installed power distribution system, testing some or all of an installed power busway, etc. Such testing can include coupling the one or more components in the power distribution infrastructure to one or more load banks, where a load bank can generate an amount of electrical power consumption which corresponds to electrical power consumption by one or more electrical loads which can be installed at the site. As a result, the load bank can serve as a test load which simulates the electrical power consumption by one or more live loads.

In some embodiments, a site is configured to support electrical power consumption by a certain amount of electrical loads. Such configuration can include the site including a power distribution infrastructure which is configured to provide an amount of electrical power support which at least meets an amount of electrical power consumption by the certain amount of electrical loads which enables the loads to operate at a certain level. The amount of electrical power consumption can be referred to as the electrical power consumption requirements of the certain amount of electrical loads, where the electrical power support provided by the power distribution infrastructure is required to at least meet the electrical power consumption requirements of the certain amount of electrical loads.

As referred to herein, electrical loads installed at the site can include live loads which are supported by the power distribution infrastructure. The total amount of electrical consumption requirements which the power distribution infrastructure is configured to at least meet can be referred to herein as the total live load which can be installed in the site, which comprises the collective live loads generated by the amount of devices which can be installed at the site. Where the site includes multiple spaces in which one or more separate sets of devices can be installed, the total amount of electrical consumption which the power distribution infrastructure is configured to support in each space can be referred to as the maximum electrical power consumption of the space.

In some embodiments, incrementally installing a power distribution infrastructure includes initially installing a certain amount of minimum power distribution infrastructure to support at least one live load. Such initial installation can include installing at least one primary power distribution system and at least one initial power busway which is configured to receive primary power from the installed primary power distribution system.

In some embodiments, where incrementally installing a power distribution infrastructure includes initially installing a certain amount of minimum power distribution infrastructure to support at least one live load, the incrementally installing further comprises commissioning the installed power distribution infrastructure components before installing live loads. Such commissioning can include commissioning an initially-installed power busway. Where the site includes multiple spaces in which separate sets of live loads collectively generate a maximum electrical power consumption of the spaces in which the loads are installed, commissioning an initially-installed power busway can include verifying that the power busway can support the maximum electrical power consumption of the space in which the power busway is located.

In some embodiments, an initially-installed primary power distribution system is configured to support live loads in multiple separate spaces in a site, including spaces in which power busways are not initially installed as part of initially installing a certain amount of minimum power distribution infrastructure to support at least one live load. Commissioning the initial primary power distribution system can include verifying that the initial primary power distribution system is configured to support the maximum electrical power consumption of the multiple spaces. As a result, where the initial primary power distribution system has a power support capacity which at least meets the total live load which can be installed in the multiple spaces, commissioning the initial primary power distribution system includes verifying that the power distribution capacity of the initial primary power distribution system at least meets the total live load which can be installed in the multiple spaces.

Where the multiple spaces which the initial primary power distribution system is configured to support include spaces in which power busways are not initially installed, the initial installation of the power distribution infrastructure includes installing at least some power distribution infrastructure components which extend to each of the multiple spaces in electrical parallel. Such installation can include installing power transmission lines and power distribution components, including busways, bus ducts, etc., which terminate in separate busway stub segments proximate to separate spaces of the multiple spaces. Each busway stub segment can be a portion of a separate future power busway which can be coupled to a primary power distribution system, including a busway segment which comprises one end of a future power busway which can be installed as part of future incremental installation of the power distribution infrastructure.

Each busway stub segment can be coupled, via a power transmission line, to a separate busway disconnect switch, which is itself coupled, in parallel with other busway disconnect switches, to a primary power distribution system, such that a given busway disconnect switch is configured to selectively electrically couple or isolate a given busway stub segment from the primary power distribution system. Each busway stub segment can be mounted in a particular position relative to a separate space, such that the busway stub segment serves as a structural placeholder for the future position of a future power busway which can be installed in the space as part of future incremental installation of the power distribution infrastructure.

In some embodiments, where initial installation of a minimum amount of a power distribution infrastructure includes installing an initial primary power distribution system and an initial power busway in an initial space of a site, along which solitary busway stub segments proximate to each of the remaining spaces of the site in which initial power busways are not installed, commissioning the initial primary power distribution system can include electrically coupling a set of load banks to the primary power distribution system, where the load banks collectively generate a total amount of electrical power consumption which simulates the maximum electrical power consumption which can be installed in the multiple spaces of the site and electrically coupled to the initial primary power distribution system, to verify that the primary power distribution is configured to support the maximum electrical power consumption which can be installed in the multiple spaces and electrically coupled to the initial primary power distribution system.

Coupling a set of load banks to the initial primary power distribution system can include coupling separate load banks to separate initial power busways, solitary busway stub segments, etc. so that the set of load banks are electrically coupled to the initial primary power distribution system in parallel and can collectively simulate the maximum electrical power consumption which can be installed in the multiple spaces via the separate maximum electrical power consumptions which can be installed in the separate spaces. As a result, commissioning the initial primary power distribution system can include commissioning the instances of power transmission lines and busway stub segments which extend to the various spaces, as well as commissioning the initial power busways installed in one or more spaces. Each separate load bank can be configured to provide a separate test load which corresponds to the maximum electrical power consumption which can be installed a given space of the site, and separate load banks can be coupled to separate initial power busways and solitary busway stub segments installed in the site.

Figure 3:
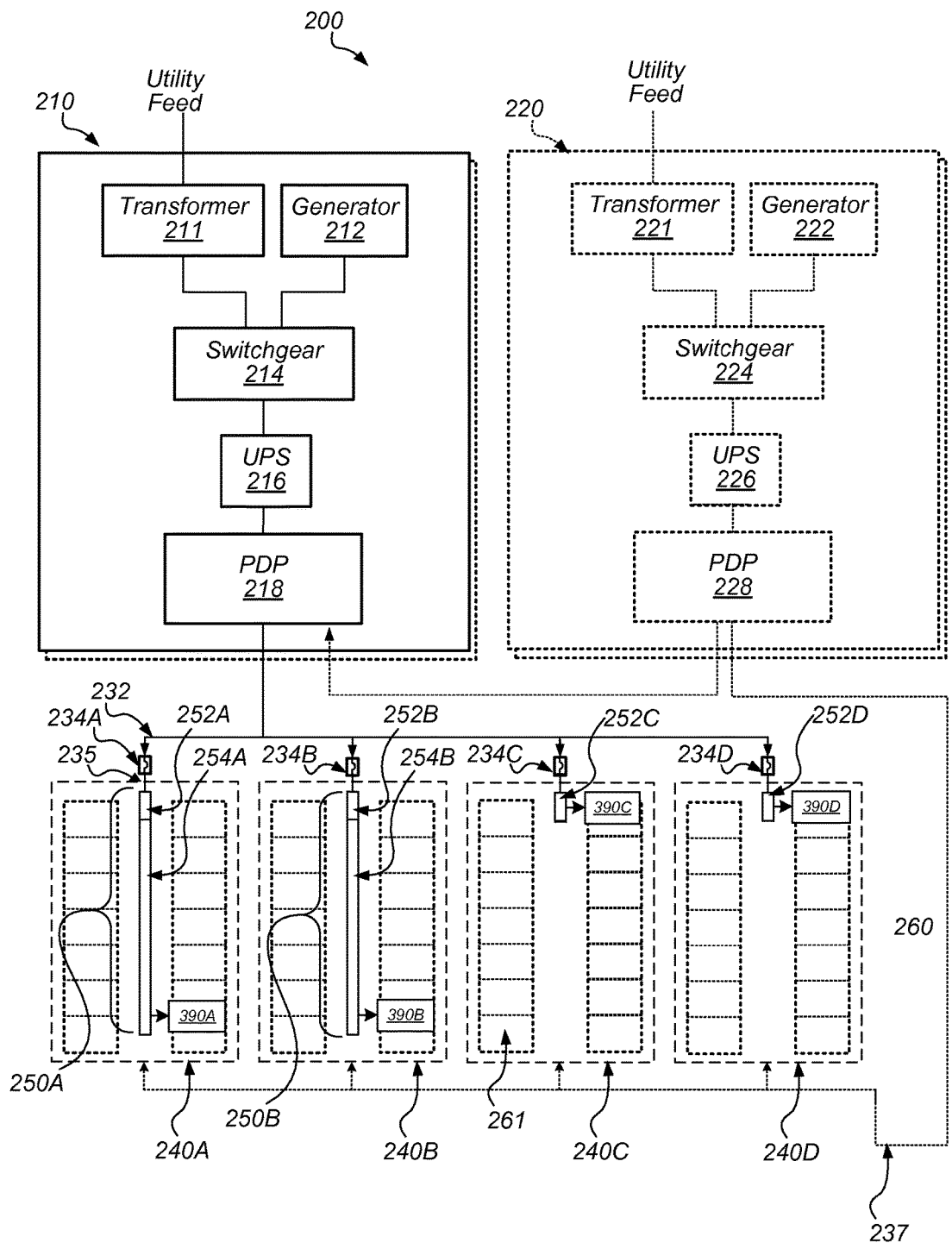
FIG. 3 is a schematic diagram illustrating commissioning a power distribution system and one or more installed initial power busways at a site, according to some embodiments.

FIG. 3 is a schematic diagram illustrating commissioning an initial power distribution system and one or more installed initial power busways at a site, according to some embodiments. The site can include the data center 100 shown in FIG. 1. The power distribution infrastructure 200 illustrated in FIG. 3 can be included in any of the embodiments of data centers included herein, including the data center 100 shown in FIG. 1.

As shown in FIG. 3, initial installation of power distribution infrastructure 200 includes installing an initial primary power distribution system 210, a set of power transmission lines 232, busway disconnect switches 234A-D, and busway stub segments 252A-D which extend the power distribution infrastructure to each separate space 240A-D, and installing a set of initial power busways 250A-B in spaces 240A-B in which live loads are to be installed. For example, in the illustrated embodiment, each space 240 includes a total of 14 separate load spaces 261 in which separate live loads can be installed, and the illustrated installation of system 210, infrastructure 232, 234, 252A-D, and busways 250A-B can be in response to a determination that more than 14 live loads are to be installed, such that power busways are required to be installed in at least two spaces 240A-B to support the live loads.

As shown, initial installation of infrastructure 200 does not necessarily include installing additional primary power distribution systems 210, secondary power distribution systems 200, etc. In some embodiments, one or more secondary power distribution system 220, additional primary power distribution systems 210, some combination thereof, etc. are installed as part of initial installation of infrastructure 200.

As shown, commissioning of the initial power distribution infrastructure components includes electrically coupling a set of load banks 390A-D to the initial primary power distribution system 210 via the separate power pathways, through at least infrastructure components 232, 234A-D, 235, 252A-D. Each separate load bank 390 can be a test load which is configured to generate an amount of electrical power consumption which corresponds to the electrical power consumption by the maximum amount of live loads which can be installed in the spaces 261 in a given space 240, so that each separate load bank can simulate electrical power consumption by the maximum amount of live loads which can be installed in a separate space 240 and the set of load banks can collectively simulate electrical power consumption by the maximum amount of live loads which can be installed in the multiple spaces 240A-D and supported by initial primary power distribution system 210.

As shown, load banks 390C-D are each coupled to separate solitary busway stub segments 252C-D which are installed proximate to separate spaces 240C-D, where the load banks 390C-D can be operated to simulate electrical power consumption by the maximum amount of live loads which can be installed in the separate spaces 240C-D through infrastructure components 232, 234C-D, 235, and 252C-D, thereby verifying that the total live loads which can be installed in the separate spaces 240C-D can be supported by the initial primary power distribution system 210 and at least the infrastructure 232, 234C-D, 235, 252C-D.

As shown, load banks 390A-B are each coupled to separate initial power busways which are installed in separate spaces 240A-B, where the load banks 390A-B can be operated to simulate the electrical power consumption by the maximum amount of live loads which can be installed in the separate spaces 240A-B through infrastructure components 232, 234C-D, 235, and busways 250A-B thereby verifying that electrical power consumption by the maximum amount of live loads which can be installed in the separate spaces 240A-B can be supported by the initial primary power distribution system 210 and at least the infrastructure 232, 234A-B, 235, 252A-B.

As shown, the load banks 390A-B are coupled to the separate busways 250A-B at respective distal ends of the busways 250A-B, relative to the proximate ends of the busways 250A-B which are coupled to separate busway disconnect switches 234A-B and thus the initial primary power distribution system. As a result, operating the load banks 390A-B results in simulating the electrical power consumption by the maximum amount of live loads which can be installed in the spaces 240A-B via the respective entire lengths of the respective busways 250A-B, thereby enabling verification that the busways 250A-B are configured to support the electrical power consumption by the maximum amount of live loads which can be installed in the separate space 240A-B along an entire length of the respective power busway.

Commissioning the initially-installed power distribution infrastructure components shown in FIG. 3 can include operating all load banks 390A-D concurrently to simulate the electrical power consumption by the maximum amount of live loads which can be installed in all spaces 240A-D on the initial primary power distribution system 210, so that the system 210 can be verified as being configured to support the maximum amount of live loads which can be installed in all spaces 240A-D.

Figure 4:
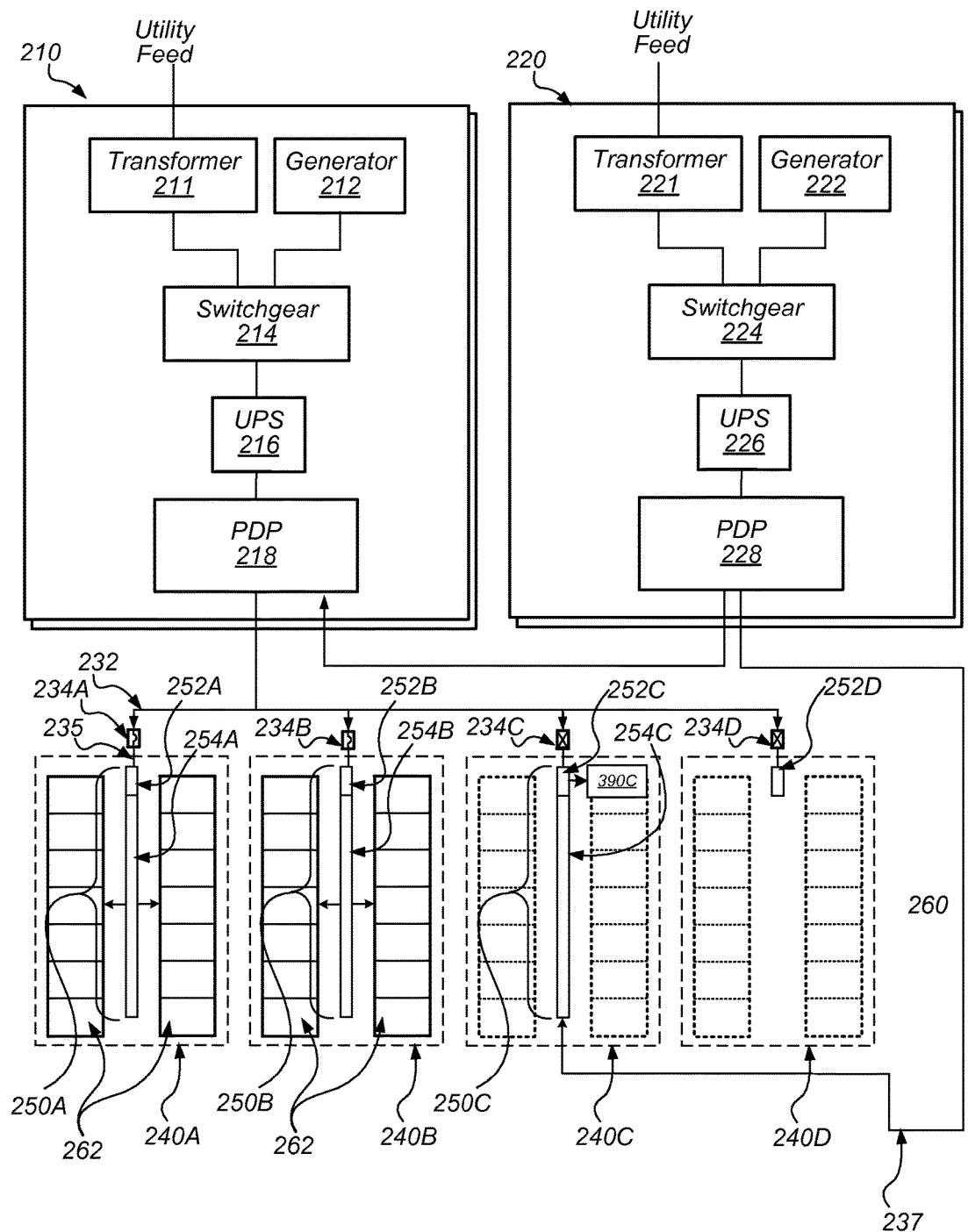
FIG. 4 is a schematic diagram illustrating incremental installation and commissioning of additional power busways, via power received from a secondary power distribution system, concurrently with operating electrical loads coupled to initial power busways from a primary power distribution system at a site, according to some embodiments.

FIG. 4 is a schematic diagram illustrating incremental installation and commissioning of additional power busways, via power received from a secondary power distribution system, concurrently with operating electrical loads coupled to initial power busways from a primary power distribution system at a site, according to some embodiments. The site can include the data center 100 shown in FIG. 1. The power distribution infrastructure 200 illustrated in FIG. 4 can be included in any of the embodiments of data centers included herein, including the data center 100 shown in FIG. 1.

In some embodiments, incremental installation of additional power busways, subsequent to initial installation of a primary power distribution system and at least one initial power busway, includes installing and commissioning an additional power busway concurrently with the installed primary power distribution system supporting a live load.

As shown in FIG. 4, power busways 250A-B are installed in spaces 240A-B and two separate sets 260 of live loads 262 are installed in each of spaces 240A-B, so that the primary power distribution system 210 is supporting electrical power consumption by the total live loads 262 installed in spaces 240A-B.

As shown, installing an additional power busway 250C in a space 240C includes coupling additional busway segments 254C in series to the busway stub segment 252C which is already present in the space 240C.

In some embodiments, commissioning an additional power busway in a power distribution infrastructure is implemented in electrical isolation from the primary power distribution systems installed in the power distribution infrastructure, so that the live loads supported by the primary power distribution systems are isolated from the additional power busway during commissioning of the additional power busway. As a result, the risk of the power support of the live loads by the power distribution infrastructure being interrupted as a result of commissioning an additional power busway is mitigated, further mitigating the risk of a loss of capacity, including computing capacity, provided by the live loads.

In some embodiments, commissioning an additional power busway in electrical isolation from a primary power distribution system includes electrically isolating, from the primary power distribution system, a portion of the power distribution infrastructure which includes both the additional power busway and at least some power distribution infrastructure components which have been previously commissioned. For example, as shown in FIG. 4, busway disconnect switch 234C is open, so that the components isolated from system 210 includes the previously-commissioned busway disconnect switch 234C and busway stub segment 252C, as well as the additional power busway 250C comprising the stub segment 252C and the newly-coupled segments 254C.

In some embodiments, commissioning an additional power busway in electrical isolation from a primary power distribution system which is supporting one or more live loads includes electrically coupling the additional power busway to one or more secondary power distribution systems which are independent of the primary power distribution system. Such electrical couplings, via one or more instances of power transmission lines coupled to the additional power busway, can be temporary, such that the additional power busway is electrically decoupled from the secondary power distribution system upon completion of commissioning the additional power busway.

In some embodiments, commissioning an additional power busway in electrical isolation from a primary power distribution system includes coupling a load bank to the power busway, where the load bank is configured to generate an amount of electrical power consumption which corresponds to the electrical power consumption by the maximum amount of live loads which can be installed in the same space as the power busway. As a result, the load bank can simulate the electrical power consumption by the maximum amount of live loads which can be installed in the space. The test load can be used to verify that the additional power busway is configured to support the maximum amount of live loads which can be installed in the space.

In some embodiments, commissioning an additional power busway in electrical isolation from a primary power distribution system includes coupling a load bank to one end of the power busway and coupling the power busway to a secondary power distribution system at an opposite end of the power busway, so that a test load generated by the load bank is supported by secondary power which is carried Ove an entire length of the additional power busway. As a result, the additional power busway can be verified as being configured to support the test load over its entire length. As shown, a load bank 390C is coupled to a proximate end of busway 250C, which can include coupling the bank 390C to the busway stub segment 252C, while a power transmission line 237 which is electrically coupled to secondary power distribution system 220 is coupled to a distal end of the busway 250 which is an opposite end of the busway 250C from the proximate end. Therefore, when load bank 390C generates a test load which simulates the total live load which can be installed in the space 240C, the test load is supported, via secondary power received at the distal end from line 237, along the entirety of the power busway 250C, thereby enabling verification that the power busway 250C can support the total live load which can be installed in the space along its entire length.

Upon completion of the verification, commissioning of busway 250C can be completed, upon which line 237 and bank 390C can be decoupled from busway 250C, and the busway disconnect switch 234C can be closed to electrically couple the busway 250C to system 210, so that live loads can be installed in space 240C and be supported, via busway 250C, by primary power distributed by system 210.

As shown in FIG. 4, commissioning a power busway 250 via a load bank 390 coupled to one end of the busway 250 and a secondary power distribution system coupled to an opposite end of the busway 250 can include coupling the secondary power distribution system 220, via line 237, to the distal end which is opposite from the end of the busway which is coupled to the busway disconnect switch 234. In some embodiments, the secondary power system is coupled, via line 237, to the busway stub segment 252C at the proximate end of the busway and the load bank 390C is coupled to the distal end of the busway. In some embodiments, where secondary power from the secondary power distribution system 220 is carried on a secondary power busway which extends through a space 240, installing and commissioning power busway 250C can include installing a separate secondary power busway in the same space 240C and extending an instance of power transmission lines between the secondary power busway and the additional busway 250C to electrically couple the busways, so that secondary power carried on the secondary power busway is distributed to the additional busway 250C to support electrical power consumption by the load bank 390C.

As shown, switch 234D is opened during commissioning of busway 250C, so that primary power is not supplied from system 210 to solitary busway stub segment 252D. In some embodiments, a busway disconnect switch 234 coupled to a solitary busway stub segment is opened subsequent to commissioning the stub segment and remains open until after additional busway segments are coupled to the solitary busway segment to form an additional power busway and the power busway is commissioned via secondary power.

In some embodiments, a power distribution system to which a given busway disconnect switch is electrically coupled can be changed. Such changing of a coupled power distribution system to which a power busway is coupled can require verifying that the power busway is configured to support electrical support provided by the new power distribution system. For example, a given power busway in a given space, which can have been previously verified as being configured to support a certain amount of electrical power support provided by a particular power distribution system to which the busway is coupled, can be switched from being coupled to the particular power distribution system to another separate power distribution system, where the separate power distribution system is configured to support a different amount of electrical power consumption than the particular power distribution system. In the illustrated embodiment of FIG. 4, where switch 234C is shown as being electrically coupled to a particular primary power distribution system 210 via an instance 232 of power transmission lines, the disconnect switch 234C can be switched to being electrically coupled to a separate primary power distribution system 210, secondary power distribution system 220, or the like. Verifying the power busway 250C as being configured to support the different amount of electrical power consumption that the different primary power distribution system 210 can support can be implemented as shown in FIG. 4, where the power busway 250C is electrically isolated via operation of switch 234C, a load bank 390C and instances of power transmission lines 237 are coupled to opposite ends of the busway 250C, and the load bank 390C is operated to simulate the different amount of electrical power consumption, which is received at busway 250C via secondary power from lines 237, along an entirety of the length of the busway 250C.

Figure 5:
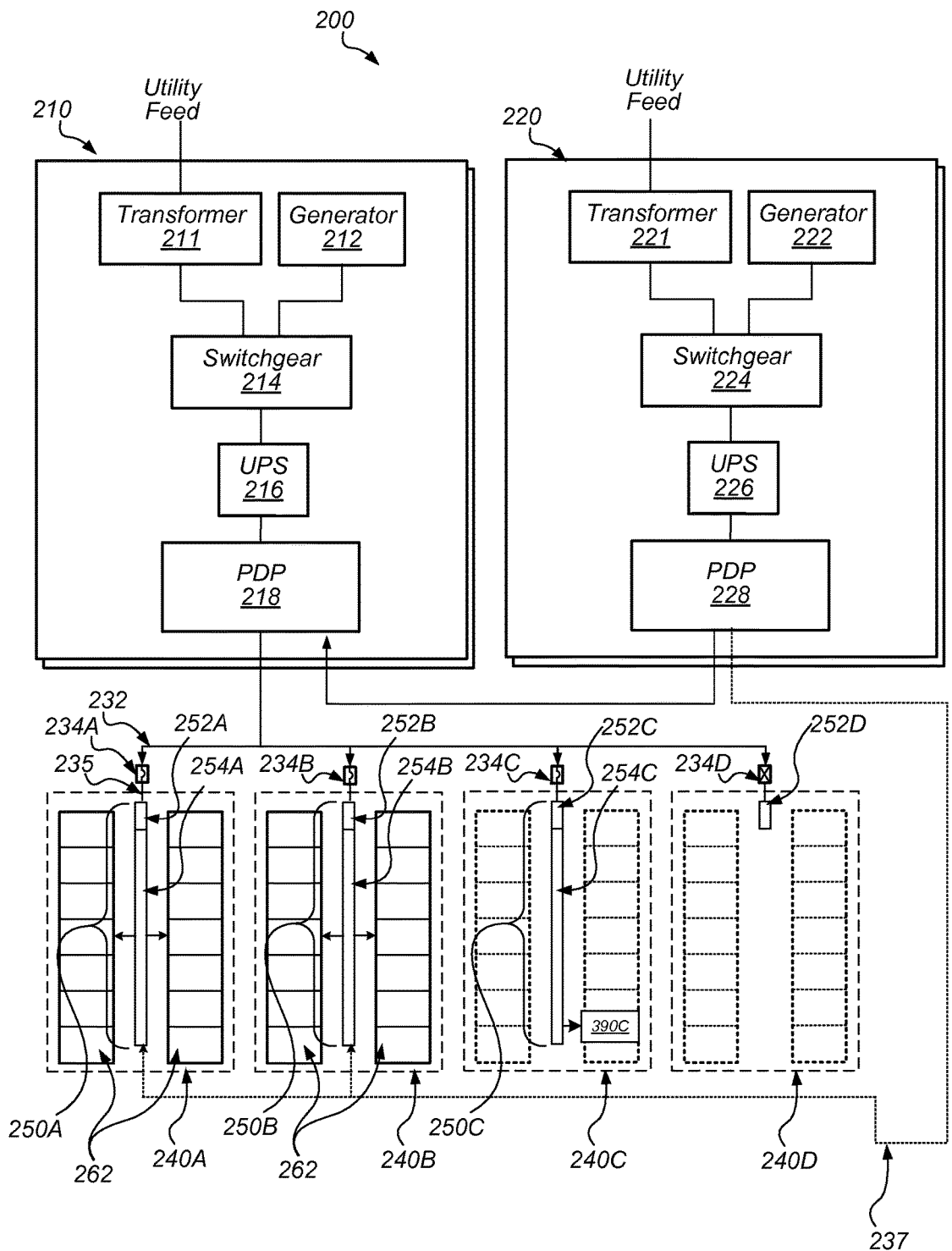
FIG. 5 is a schematic diagram illustrating incremental installation and commissioning of additional power busways concurrently with operating electrical loads coupled to initial power busways from a primary power distribution system at a site, according to some embodiments.

FIG. 5 is a schematic diagram illustrating incremental installation and commissioning of additional power busways concurrently with operating electrical loads coupled to initial power busways from a primary power distribution system at a site, according to some embodiments. The site can include the data center 100 shown in FIG. 1. The power distribution infrastructure 200 illustrated in FIG. 5 can be included in any of the embodiments of data centers included herein, including the data center 100 shown in FIG. 1.

In some embodiments, incrementally commissioning a power distribution infrastructure 200 includes commissioning incrementally-installed power busways via placing a test load on a primary power distribution system via the incrementally-installed power busways, such that the primary power distribution system supports a test load and a live load in parallel.

For example, as shown in FIG. 5, where busways 250A-B are coupled to live loads 262 and the primary power distribution system 210 is supporting the live loads 262 via busways 250A-B, commissioning a newly-installed additional power busway 250C can include coupling a load bank 390C to the additional busway 250C and closing the busway disconnect switch 234C coupled to the busway 250C, so that the test load provided by the load bank 390C is supported, via the busway 250C, by primary power distributed from the primary power distribution system 210. The load bank 239C can generate an amount of electrical power consumption which corresponds with the electrical power consumption by the maximum amount of live loads which can be installed in space 240C, such that the test load simulates the maximum amount of live loads which can be installed. Such a commissioning process results in the additional busway 250C being verified as being configured to support the electrical power consumption by the maximum amount of live loads which can be installed in space 240C, and the power distribution system 210 is verified as being configured to support the maximum amount of live loads which can be installed in space 240C in parallel with the live loads 262 already installed in spaces 240A-B.

In some embodiments, where an additional power busway is commissioned using primary power, such that a primary power distribution system supports live loads and test loads in parallel, the commissioning can include switching at least some installed live loads 262 from receiving primary power to receiving secondary power from one or more secondary power distribution systems, such that the total live loads supported by the primary power distribution system 210 is reduced during commissioning of the power busway 250C via primary power. For example, where secondary power distribution system 220 is electrically coupled to the live loads 262 via separate instances of power transmission lines 237 from the lines 232, 235, 250A-B which distribute primary power to the loads 262, at least some live loads which are electrically coupled to the secondary power distribution system 220 via one or more lines 237 can be switched, via operation of one or more switching devices, from receiving primary power to receiving secondary power via the one or more lines 237. Such switching of live loads 262 to secondary power during commissioning of busway 250C via primary power mitigates a risk of power failure to the live loads 262 as a result of the commissioning process. For example, if the commissioning of busway 250C via primary power support of the test load provided by bank 390C results in overloading of one or more components 211-218 in primary power distribution system 210, and thus an at least partial shutdown of the system 210, the live loads 262 which are switched to secondary power from system 220 via lines 237 do not experience an interruption in power support. Where the live loads 262 include rack computer systems which provide computing capacity, switching at least some such loads 262 to secondary power prior to initiating commissioning of the busway 250C via primary power support of the test load generated by bank 390C at least partially mitigates a risk of the loss of computing capacity provided by the switched live loads 262 as a result of the commissioning process.

In some embodiments, a limited selection of the live loads 262 are switched to secondary power during commissioning of the additional busway. For example, a limited selection of loads 262 can be electrically coupled to system 220 (e.g., N+1 power support redundancy) and a remainder of the loads 262 can be restricted to being electrically coupled to system 210 (e.g., N power support redundancy), so that the limited selection of loads 262 are switched to system 220 and the remainder of loads 262 remain electrically coupled to system 210.

Loads which are switched to system 220 can be switched back to receiving power support from system 210 upon completion of commissioning of the additional power busway. Such completion can include termination of the test load by bank 390C, decoupling bank 390C from busway 250C, some combination thereof, etc.

Figure 6:
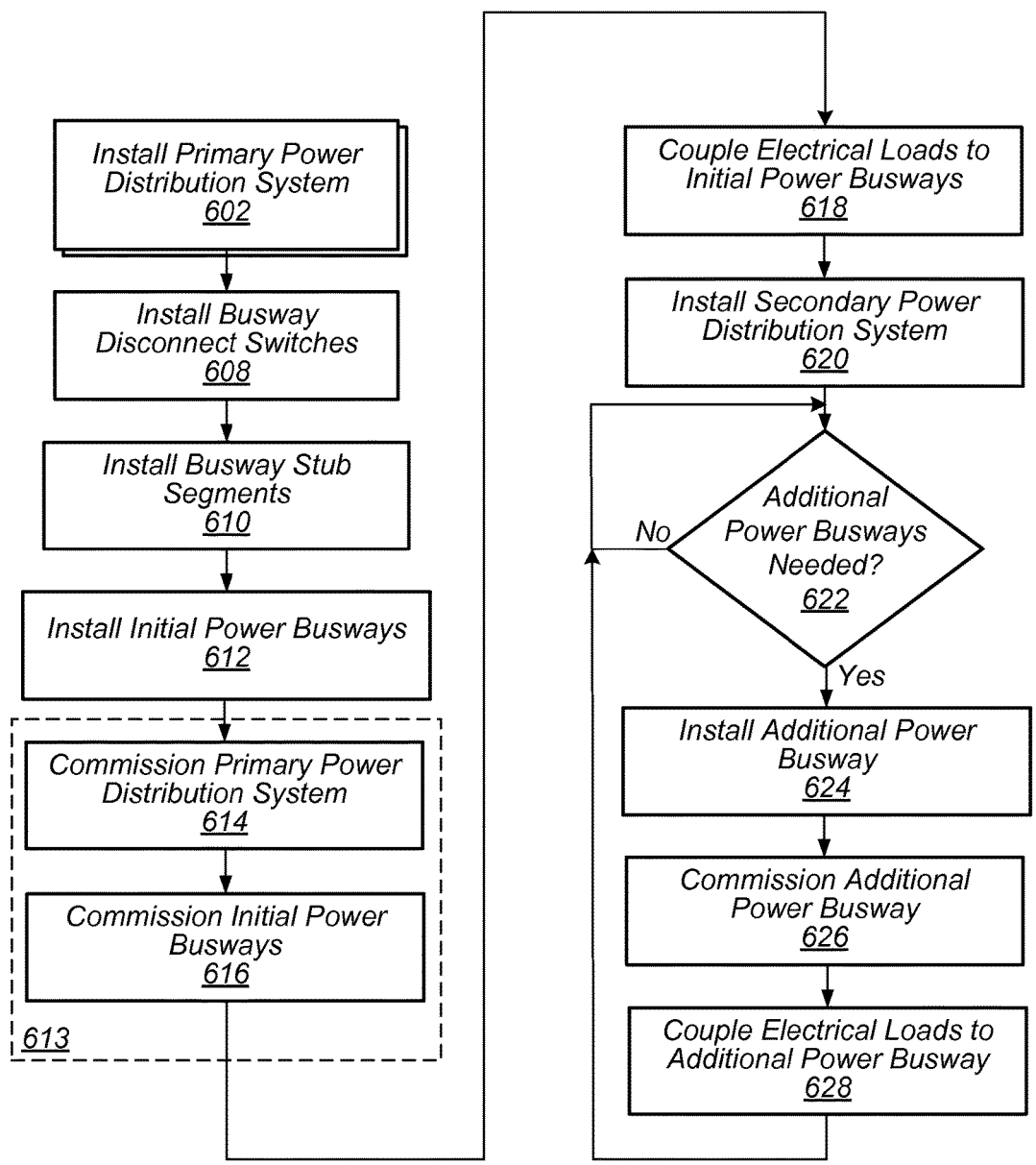
FIG. 6 illustrates incrementally installing and commissioning a power distribution infrastructure, according to some embodiments.

FIG. 6 illustrates incrementally installing and commissioning a power distribution infrastructure, according to some embodiments. The incremental installation and commissioning can be implemented with regard to any of the embodiments of power distribution infrastructures included herein.

At 602, one or more primary power distribution systems are installed at a site. The site can include a data center. A power distribution system can include one or more power distribution components, which can include one or more transformers, generators, transfer switches, distribution switchboards, uninterruptible power supplies, power distribution units, power distribution panels, some combination thereof, etc. In some embodiments, where a site is configured to accommodate multiple primary power distribution systems, the installing at 602 can include one or more of installing a single power distribution system, multiple independent power distribution systems, etc. In some embodiments, installing a primary power distribution system can include installing at least a portion of an Electric Power Monitoring System (EPMS).

As shown with regard to FIG. 2-5, a given power distribution system can include one or more of a utility power feed, UPS, utility transfer switch, power distribution unit, etc. Installation of a primary power distribution system can include electrically coupling an output of the primary power distribution system, including a distribution switchboard, to one or more power transmission lines, including one or more busways, at the site. Separate primary power distribution systems can be coupled to separate instances of power transmission lines, including separate busways.

In some embodiments, where multiple primary power distribution systems are installed at a site, the separate primary power distribution systems are configured to provide primary power support to separate electrical loads at the site. In some embodiments, the separate primary power distribution systems are configured to both provide power support to one or more electrical loads, such that the electrical loads receive @N power support redundancy.

At 606, one or more sets of busway disconnect switches are installed at the site. Such installation can include electrically coupling the busway disconnect switches in parallel with a downstream end of at least one power distribution system, such that the one or more sets of busway disconnect switches, when installed, are configured to receive electrical power from the at least one power distribution system in parallel. Installation of the one or more sets of busway disconnect switches can include coupling a set of busway disconnect switches to one or more instances of power transmission lines which are themselves coupled to a downstream side of one or more primary power distribution systems, such that the one or more sets of busway disconnect switches are electrically coupled in parallel with one or more primary power distribution systems via the one or more instances of power transmission lines. Where the one or more instances of power transmission lines includes one or more busways which are electrically coupled to a downstream end of one or more primary power distribution systems, separate busway disconnect switches can be coupled to the one or more busways at different locations along the one or more busways.

In some embodiments, where a site includes multiple separate spaces in which separate sets of electrical loads are to be installed, each separate busway disconnect switch can be coupled to one or more instances of power transmission lines at separate locations which are proximate to a separate space, so that each separate busway disconnect switch is configured to supply electrical power to electrical loads mounted in the respective space proximate to the respective busway disconnect switch.

At 610, one or more sets of busway stub segments are installed in the site. Installation of a busway segment can include coupling the busway stub segment to a busway disconnect switch, so that the busway stub segment is configured to the electrically coupled to a primary power distribution system and therefore is configured to receive electrical power from the primary power distribution system, based on a switching position of the busway disconnect switch to which the busway stub segment is coupled. A busway stub segment can include a truncated busway segment which is configured through a limited portion of a space. Where installing the busway stub segments includes coupling each busway stub segment to a separate busway disconnect switch, the installing can include operating each busway disconnect switch so that each installed busway stub segment is electrically isolated from the installed primary power distribution system. The busway disconnect switches can be operated before the busway stub segments are coupled to the busway disconnect switches, after, some combination thereof, etc.

In some embodiments, where a site includes multiple separate spaces in which separate sets of electrical loads are to be installed, each separate busway stub segment can be installed proximate to separate spaces, including at a particular end of each separate space. Where the spaces are arranged to extend in parallel, the busway stub segments can be installed proximate to a common end of each space, such that the busway stub segments are located proximate to each separate busway disconnect switch can be coupled to one or more instances of power transmission lines at separate locations which are proximate to a separate space, so that each separate busway disconnect switch is configured to supply electrical power to electrical loads mounted in the respective space proximate to the respective busway disconnect switch.

As a result, in some embodiments, installing busway stub segments at the site can result in a set of busway stub segments being electrically coupled in parallel with at least one primary power distribution system at separate spaces in the site, such that each separate busway stub segment is configured to supply electrical power from the primary power distribution system to one or more electrical loads located in the respective space in which the respective busway stub segment is located.

At 612, one or more initial power busways are installed at the site. Installing a power busway at the site can include installing a power busway in a particular space in the site, such that the installed power busway is configured to support electrical power consumption by electrical loads in the particular space. Installing a power busway in a particular space can include coupling one or more busway segments, in series, with a busway stub segment installed proximate to the particular space, such that the installed power busway, comprising the busway stub segment and one or more busway segments coupled thereto, extends through at least a portion of the particular space. The power busway which is installed based on coupling the busway segments to the busway stub segment can be configured to be electrically coupled to one or more sets of electrical loads, including one or more rows of rack computer systems, in the space via one or more instances of power transmission lines, busway tap boxes, etc. which can be coupled to the busway. In some embodiments, to be electrically coupled to one or more sets of electrical loads, the power busway is configured to be electrically coupled to a transfer switch assembly mounted in the space, where the transfer switch assembly is coupled to the set of electrical loads via one or more separate branch circuits and is configured to selectively distribute electrical power from the power busway or power received from a separate power distribution system, including a secondary power distribution system, to the electrical loads via the one or more separate branch circuits. In some embodiments, installing one or more initial power busways includes closing a busway disconnect to which the busway stub segment comprising the one or more initial power busways is coupled, such that the one or more initial power busways are electrically coupled to one or more primary power distribution systems.

In some embodiments, a particular quantity of initial power busways installed at 612 is based on the amount of power support required to support electrical loads initially installed at the site, a number of spaces in the site at which the electrical loads are to be initially installed, etc. For example, where the site is a data center site, an initial amount of computing capacity may be required to be installed at the site, via the installation of an initial set of rack computer systems. The initial sets of rack computer systems can be installed in one or more particular spaces, and each set of rack computer systems installed in each space can be associated with an electrical power consumption requirement which is the amount of electrical power required to be supplied to the set of rack computer systems to support computing operations by the respective set of rack computer systems. For example, where the initial rack computer systems to be installed at a data centers are of a sufficient quantity to necessitate installing the initial rack computer systems in two separate spaces in the data center, at least two initial power busways may be installed at 612, where each separate power busway is installed in a separate space, so that the initial power busways are configured to support electrical power consumption by the rack computer systems installed in the separate spaces.

In some embodiments, installing a power busway includes installing one or more instances of EPMS equipment associated with monitoring the power busway.

At 613, the installed equipment is commissioned. Such commissioning includes commissioning the installed primary power distribution system, at 614, such that the installed primary power distribution system is verified as being configured to support electrical power consumption corresponding to the power support capacity of the primary power distribution system, which can include being configured to support electrical power consumption of the maximum amount of electrical loads which can be electrically coupled to the primary power distribution system. Such commissioning includes commissioning the installed initial power busways, at 616, such that each installed power busway is verified as being configured to support an amount of electrical power consumption corresponding to electrical power consumption by a set of electrical loads which can be electrically coupled to the respective installed power busway. For example, where an installed power busway extends through a particular space in the site, and where the site is configured to accommodate two sets of thirty electrical loads which are each estimated to consume 10 KWa when installed, commissioning the power busway can include verifying that the power busway is configured to support 600 KWa of electrical power consumption.

In some embodiments, the commissioning 613 includes coupling load banks to each of the subway stub segments and power busways, where each separate load bank is configured to generate an amount of electrical power consumption which simulates electrical power consumption by one or more sets of electrical loads, so that the sum of the load banks collectively simulate a electrical power consumption by the maximum amount of electrical loads which can be electrically coupled to the installed primary power distribution system and tests both the capacity of the installed primary power distribution system to support the maximum amount of electrical loads and tests the capacity of the installed power busways to support a maximum amount of electrical loads which can be installed in a space in which the installed power busways are located.

In some embodiments, commissioning a primary power distribution system includes performing a series of tests. For example, once power distribution components included in the primary power distribution system have been started up and are available for normal operation with EPMS indication, a component level Functional Performance Testing (FPT) can be performed for each piece of equipment. These FPT's can include testing each piece of power distribution system components for correct installation, individual manual and automatic operation and verification of EPMS monitored points and alarms. Such testing can include separately testing separate power distribution system components included in the primary power distribution system, including testing one or more instances of generators, utility switchboards, critical distribution boards, UPSs, automatic transfer switches (ATSs), power distribution panels (PDPs), panelboards, power distribution units (PDUs), EPMS, some combination thereof, etc.

In some embodiments, once component level testing has been completed for the power distribution system components included in the one or more primary power distribution systems, one or more of 614, 616 includes system level testing for one or more installed power distribution system components, power busways, etc. System level tests can include one or more of: testing power output of one or more of UPSs and CDBs included in one or more primary power distribution systems, testing PDP transfer of power source from a primary power distribution system to a secondary power distribution system, etc.

In some embodiments, once system level testing has been completed, one or more of 614, 616 includes Integrated System Testing (IST) of the one or more primary power distribution systems, power busways, etc. Electrical Integrated System level tests can include testing one or more of: staging increasing electrical power consumption, loss of utility power, restoration of utility power, complete loss of utility power, secondary power distribution system operations, maintenance operations, staging decreasing electrical power consumption, etc.

Staging Increasing electrical power consumption testing can include a procedure which verifies loading of the power distribution system components supplying electrical power to the site. The test can begin with no load bank electrical power consumption. Load bank electrical power consumption can be applied in various steps to simulate rack loading. Electrical power consumption can continue to be stepped until reaching design electrical load for the site. Proper reaction from Air Handling Units (AHU's), Computer Room Air Handling Units (CRAHU's), and Exhaust Fans (EF's) can be documented and systems can be verified as reaching steady state between the load steps up to design full electrical support capacity of the installed primary power distribution systems.

Loss of Utility Power testing can include, with the primary power distribution system supporting an amount of electrical power consumption corresponding to the power support capacity of the primary power distribution system, initiating a loss of the utility service at a Main Switchboard. The test can include verifying facility critical load is carried on the UPS system as the facility transfers to the diesel Generators. The test can include verifying that mechanical loads restart and that space temperatures or critical equipment rooms remains within specification. The test can demonstrate switchgear control system and mechanical system response to a power loss and that a Building Management System (BMS) included in the site will restart the previously running equipment after Generators assume the load.

Restoration of Utility Power testing can include, with the Data Center operating on generator at full available electrical power consumption, restoring the utility service at the Main Switchboard. The test can include verifying that the loads are transferred back to the utility service. The test can include verifying that mechanical loads restart and that space temperatures or critical equipment rooms remains within specification.

Secondary power distribution system operations testing can include a procedure which verifies power distribution infrastructure response to the loss of utility power and loss of generator power while operating under full load conditions. The secondary power distribution system is verified as assuming the electrical power consumption of one board.

Maintenance Operations testing can include a procedure which verifies electrical system response when a UPS included in an installed primary power distribution system is in bypass. The primary power distribution system can be placed onto generator power through a simulated loss of utility power. Utility power can be restored and an automatic transfer can be verified as not occurring when the UPS system is in bypass.

Staging decreasing electrical power consumption testing can include a procedure which verifies unloading of the mechanical systems serving the site. The test can begin with load banks loaded to simulate a design amount of electrical power consumption. Load bank electrical power consumption can be reduced in various steps to simulate rack unloading. The electrical power consumption can be continually stepped down until reaching no load bank electrical power consumption for the site. Proper reaction from the AHU's, CRAHU's, and EF's can be documented and systems will be expected to reach steady state between the electrical power consumption steps down from design electrical power consumption.

ISTs can test the operation of the entire installed power distribution infrastructure as a whole, under design electrical power consumption conditions, with responses to normal and emergency conditions, and verification of EPMS monitored points and alarms throughout the testing effort.

In some embodiments, upon completion of functional testing, one or more of 614, 616 includes the integration of the current phase into the previously completed or live phases. Interlocks between systems can be verified. Upon completion of the live phase(s) and the current phase integration, commissioning 614, 616 will be complete and the power distribution system will be verified as ready to support electrical loads electrically coupled to the installed power busways in the site, shown at 618.

At 620, one or more secondary power distribution systems are installed at the site and electrically coupled to one or more installed power busways. As shown with regard to FIG. 2-5, a secondary power distribution system can include some or all of the power distribution components included in one or more primary power distribution systems. Such electrical coupling can include coupling a downstream end of a secondary power distribution system to a power distribution panelboard included in a primary power distribution system, such that the power distribution panelboard is configured to selectively distribute electrical power, to one or more installed power busways, busway disconnect switches, etc. from one or more of the primary power distribution system, the secondary power distribution system, etc. The installing 620, in some embodiments, can be implemented concurrently with installing one or more primary power distribution systems at 602.

At 622, a determination is made regarding whether one or more additional power busways are needed to be installed at the site. Such a determination can be based at least in part upon a determination whether one or more sets of electrical loads are to be installed in a particular space, in the site, through which an installed power busway does not presently extend, such that electrical loads install in the space cannot be electrically coupled to a power busway in the space.

If so, at 624, an additional power busway is installed in the particular space, which can include coupling one or more busway segments to a busway stub segment installed proximate to the particular space.

In some embodiments, the installation at 624 includes installing adding the balance of the busway segments, to a busway stub segment proximate to a particular space, needed to complete the power busway in the space.

At 626, the installed additional power busway is commissioned, which includes verifying that the installed additional power busway is configured to support an amount of electrical power consumption corresponding to electrical power consumption by a set of electrical loads which can be electrically coupled to the respective installed power busway. For example, where an installed power busway extends through a particular space in the site, and where the site is configured to accommodate two sets of thirty electrical loads which are each estimated to consume 10 KWa when installed, commissioning the power busway can include verifying that the power busway is configured to support 600 KWa of electrical power consumption.

In some embodiments, the commissioning 626 includes coupling a load bank to the power busway, where the load bank is configured to generate electrical power consumption which simulates electrical power consumption by one or more sets of electrical loads which can be accommodated in the particular space, so that the load banks simulate the power busway supporting electrical power consumption by the one or more sets of electrical loads which can be accommodated in the particular space and tests the capacity of the installed additional power busway to support the electrical power consumption.

In some embodiments, the commissioning 626 includes electrically isolating the installed additional power busway from the installed primary power distribution system and coupling the additional power busway to a secondary power distribution system, so that the additional power busway is commissioned via a simulated electrical power consumption which is supported by electrical power received from the secondary power distribution system. The additional power busway can be coupled to the load bank and the secondary power distribution system at opposite ends of the additional power busway, so that the power busway is verified as being configured to support electrical power consumption by the electrical loads which can be coupled to the additional power busway, along an entire length of the additional power busway.

Commissioning the additional power busway in electrical isolation from the primary power distribution system, where the primary power distribution system is electrically coupled to initial power busways to which electrical loads are presently coupled, results in the electrical loads, which can include live loads, receiving power support from the primary power distribution system in electrical isolation from the additional power busway being tested. As a result, the additional power busway can be commissioned, via secondary power distribution system support, without affecting electrical power support provided to the installed electrical loads coupled to the previously-installed power busways. Where the installed electrical loads include live loads, including rack computer systems performing computing operations, such commissioning of the additional power busway in electrical isolation from the installed rack computer systems results in commissioning the additional power busway with reduced electrical interference of the commissioning process on the performance capacity provided by the live loads.

The connection between the additional power busway and the secondary power distribution system can be temporary for the duration of the commissioning, and subsequently removed. The busway disconnect switch coupled to the power busway can remain open to electrically isolate the power busway and thus not introducing test load to the primary power distribution system.

Commissioning an additional power busway, while electrically isolated from the primary power distribution system, via power received from a secondary power distribution system can enable separation of the test load from the live load, thereby reducing a risk to existing, live data center load which can result in removing the need to enter the PDP board of the installed primary power distribution after live loads have been coupled to, and are being supported by, the primary power distribution system at 618.

In some embodiments, commissioning 626 an installed additional power busway includes a component-level FPT performed for each piece of equipment. The live phase(s) operation can be regularly monitored while FPT's are under way. Any abnormal operation in the live phase will stop the current phase commissioning process 626 immediately. The component level FPTs can include one or more of power busway testing which can include equipment identification, physical inspection, load testing, and IR scanning under load of the installed additional power busway. The component level FPTs can include one or more of power distribution unit (PDU) testing, which can include equipment identification, physical inspection, branch circuit monitoring testing, graphics status verification, alarm verification, and page verification of one or more PDUs coupled to the power busway. The component level FPTs can include one or more of EPMS testing, which can include graphics status verification alarm verification, and page verification.

In some embodiments, commissioning 626 an installed additional power busway includes integrated system level testing which can include a heat load and capacity test performed on the additional power busway along with maintenance operations. The testing can include staging increased electrical power consumption on the power busway, which can include a procedure to verify loading of the power busway. The test can begin with no load bank electrical power consumption. Load bank electrical power consumption will be applied in various steps to simulate loading by electrical loads. Electrical power consumption will continue to be stepped until reaching design electrical power consumption for the space. Proper reaction from various instances of equipment associated with the space, including AHU's, CRAHU's, and EF's can be documented and systems can be verified as reaching steady state between the load steps up to design electrical power consumption. The testing can include staging decreased electrical power consumption on the power busway, which can include a procedure to verify unloading of the mechanical systems serving the space. The test can begin with load banks loaded to design electrical power consumption. Load bank electrical power consumption can be reduced in various steps to simulate electrical load unloading. Electrical power consumption can continue to be stepped down until reaching no load bank electrical power consumption for the space. Proper reaction from the AHU's, CRAHU's, and EF's can be documented and systems can be verified as reaching steady state between the load steps down from design electrical power consumption.

Upon completion of the commissioning at 626 the installed additional power busway will be verified as ready to support electrical loads electrically coupled to the installed power busway, shown at 628.

Figure 7:
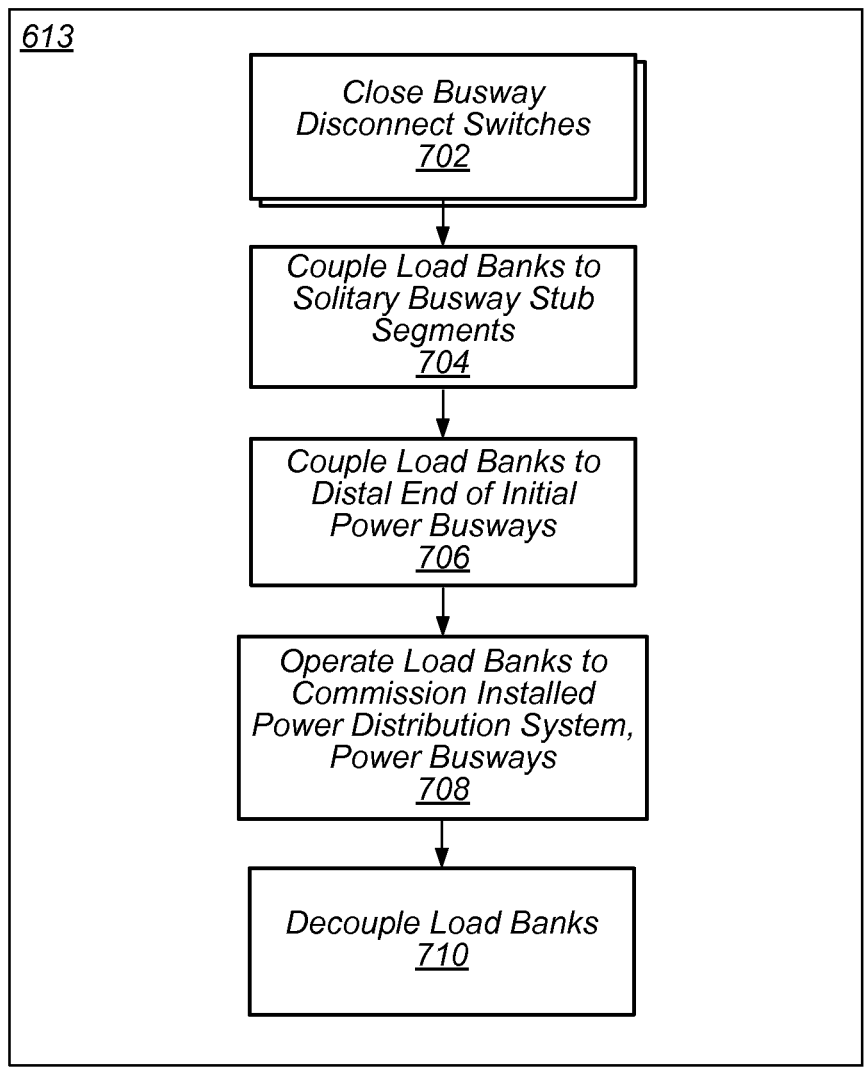
FIG. 7 illustrates commissioning a power distribution system and initial power busways in a power distribution infrastructure, according to some embodiments.

FIG. 7 illustrates commissioning a power distribution system and installed initial power busways in a power distribution infrastructure, according to some embodiments. The commissioning can be implemented with regard to any of the embodiments of power distribution infrastructures included herein. As shown, the commissioning shown in FIG. 7 can be included within the commissioning 613 shown in FIG. 6.

At 702, the installed busway disconnect switches are closed, so that the busway disconnect switches can distribute electrical power received in parallel from the installed primary power distribution system. Some busway disconnect switches can be coupled to installed busway stub segments which are coupled with one or more additional busway segments to form an initial power busway. Some busway disconnect switches can be coupled to installed busway stub segments which are not coupled to any additional busway segments, and are thus referred to as "solitary busway stub segments". Closing the busway disconnect switches enables the installed primary power distribution system to support parallel loads on each of the solitary busway stub segments and initial power busways.

At 704, load banks are coupled to the solitary busway stub segments. The load banks coupled to a solitary busway stub segments can generate an amount of electrical power consumption which corresponds to the design collective electrical power consumption of the maximum amount of electrical loads which can be installed in the particular space associated with the solitary busway stub segment. Coupling one or more load banks which are configured to generate an amount of electrical power consumption which corresponds to the design collective electrical power consumption can be referred to as being configured to simulate the design collective electrical power consumption. Coupling load banks to each of the solitary busway stub segments can configure the power distribution infrastructure to simulate electrical power consumption by the maximum amount of electrical loads which can be installed in each space at the site in which power busways are not yet installed, as the load banks can draw electrical power from the primary power distribution system via the installed busway disconnect switches and busway stub segments in parallel.

At 706, load banks are coupled to the distal ends of the installed initial power busways. The load banks coupled to a power busway, similarly to the load banks coupled to the solitary busway stub segments, can generate an amount of electrical power consumption which corresponds to the design collective electrical power consumption for the space in which the power busway is located.

An installed power busway can include a proximate end and a distal end, where the proximate end refers to an end of the power busway, comprising the busway stub segment comprised in the power busway, which is coupled to a busway disconnect switch, and the distal end refers to the opposite end of the power busway. Where a power busway is electrically coupled to a power distribution system via the busway disconnect switch, such that the power busway is configured to receive electrical power from the primary power distribution system via the proximate end of the power busway, coupling a load bank to the distal end of the power busway configures the power busway to carry electrical power along an entire length of the power busway, from the proximate end to the distal end, thereby enabling the entire length of the power busway to be verified as being configured to support electrical power consumption by the maximum amount of electrical loads which can be installed in the space in which the power busway is located.

Where the primary power distribution system is configured to support, in parallel, electrical power consumption by the maximum amount of electrical loads which can be installed in each of the spaces in the site, where the collective electrical power consumption are referred to as a design site electrical power consumption, coupling load banks to each of the busway stub segments, installed power busways, etc. in each of the spaces can configure the power distribution infrastructure to simulate the design site electrical power consumption on the installed power distribution infrastructure equipment, including the installed primary power distribution system.

At 708, the load banks coupled to the installed power busways and the solitary busway stub segments are operated, as part of the commissioning described above with reference to commissioning 613 of FIG. 6, such that the load banks each simulate design collective electrical power consumption on the equipment which is configured to provide electrical power support to a single space, including a busway disconnect switch, busway stub segment, power busway, etc. and further such that the load banks collectively simulate a design site electrical power consumption on the installed primary power distribution system. As a result, the primary power distribution system can be verified as being configured to support the design site electrical power consumption, and the installed busway disconnect switches, busway stub segments, and power busways can be verified as each being configured to support a separate design collective electrical power consumption corresponding to the respective space associated with the respective equipment.

At 710, following completion of the commissioning process, the load banks are decoupled from the initial power busways and solitary busway stub segments. Electrical loads can be installed in the spaces in which the initial power busways are installed, where such installation includes electrically coupling the electrical loads to the initial power busways, such that the electrical loads can receive electrical power support from the installed primary power distribution system.

Figure 8:
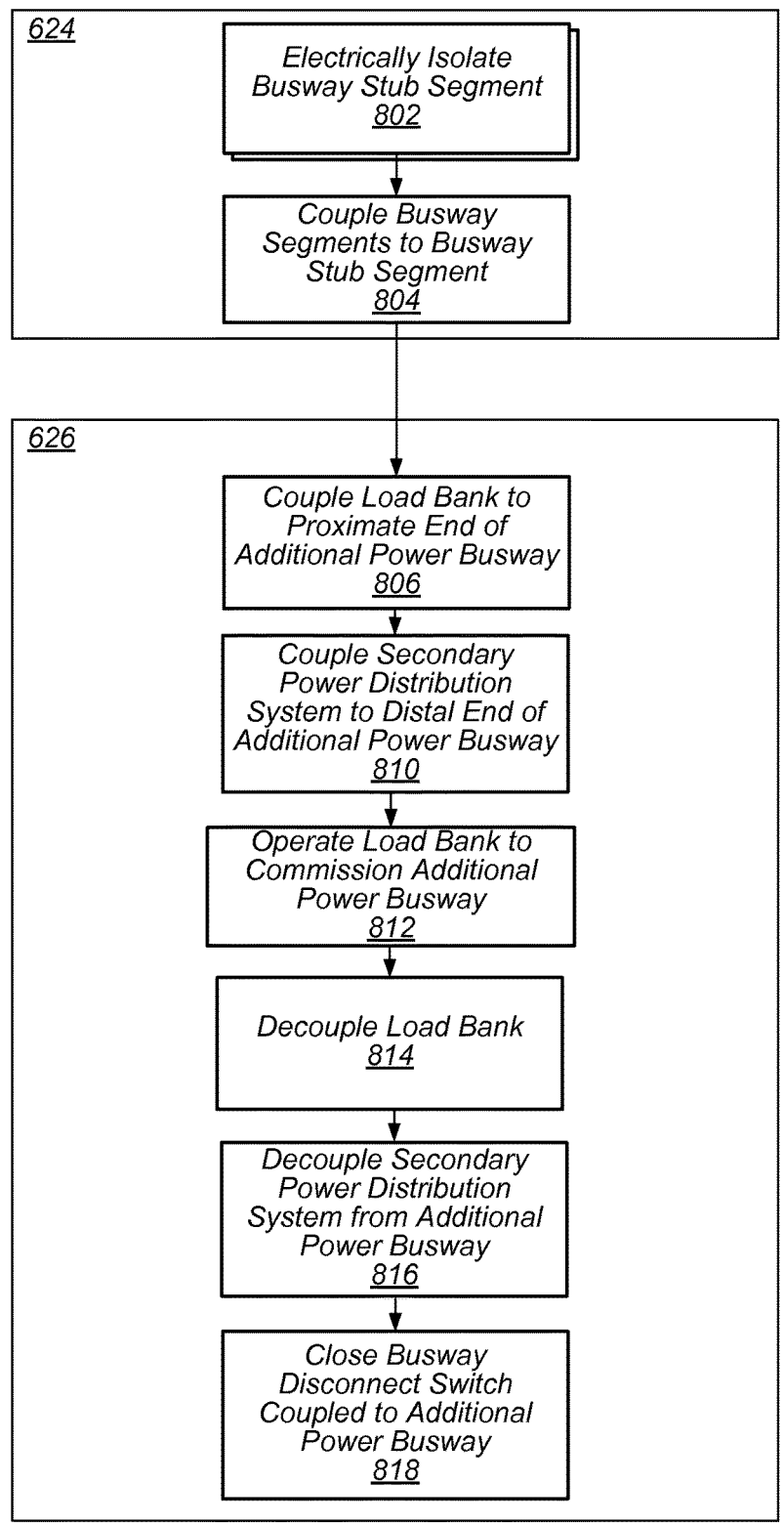
FIG. 8 illustrates installing and commissioning an additional power busway in a power distribution infrastructure, according to some embodiments.

FIG. 8 illustrates installing and commissioning an additional power busway in a power distribution infrastructure, according to some embodiments. The installing and commissioning can be implemented with regard to any of the embodiments of power distribution infrastructures included herein. As shown, the installing shown in FIG. 8 can be included within the installing 624 shown in FIG. 6. As shown, the commissioning shown in FIG. 8 can be included within the commissioning 626 shown in FIG. 6.

At 802 and 804, installing an additional power busway in a particular space in a site includes, at 802, opening the busway disconnect switch which is coupled to the busway stub segment associated with the particular space, so that the busway stub segment is electrically isolated from the installed primary power distribution system and, at 804, coupling one or more additional busway segments to the busway stub segment, in series, to establish the additional power busway which comprises, at one end, the busway stub segment and one or more additional busway segments which extend to an opposite end of the additional power subway. The end of the additional power busway which includes the busway stub segment, and includes a connection to the opened busway disconnect switch, is referred to herein as the proximate end of the additional power busway, and the opposite end is referred to herein as the distal end.

At 806, a load bank is coupled to the proximate end of the additional power busway. The load bank can be coupled via one or more instance of power transmission lines, busway tap boxes, etc. such that the power busway is configured to supply electrical power to the load bank via at least the proximate end of the power busway.

At 810, a secondary power distribution system is coupled to the distal end of the additional power busway, such that the additional power busway is configured to receive electrical power from the secondary power distribution system. The secondary power distribution system can be coupled to the additional power busway via an instance of power transmission lines which is extended from a downstream end of the secondary power distribution system, one or more other instances of power transmission lines which are electrically coupled to a downstream end of the secondary power distribution system, etc.

Coupling a load bank to a proximate end of the additional power busway installed in a particular space, and a secondary power distribution system to a distal end of the additional power busway, configures the additional power busway to support electrical power consumption of the load bank, where the electrical power consumption of the load bank corresponds to a design collective electrical power consumption by a set of electrical loads which can be installed in the particular space, along an entire length of the additional power busway, via electrical power supplied by the secondary power distribution system, thereby enabling the entire length of the power busway to be verified as being configured to support the design collective electrical power consumption. Further, doing so while the additional power busway is electrically isolated from the primary power distribution system, where the additional power busway supports the design collective electrical power consumption via secondary power received from a secondary power distribution system, enables the additional power busway to be commissioned in electrical isolation from live loads installed in the site, thereby mitigating the risk of interference of the commissioning on the operation of the live loads.

At 812, the load bank coupled to the proximate end of the additional power busway is operated, as part of the commissioning described above with reference to commissioning 626 of FIG. 6, such that the load bank generates an amount of electrical power consumption, which corresponds to the design collective electrical power consumption, which is supported by the entire length of the additional power busway. As a result, the additional power busway can be verified as being configured to support a design collective electrical power consumption associated with the particular space, while being electrically isolated from other power distribution infrastructure equipment which has already been commissioned and is supporting live loads.

At 814, following completion of the commissioning process, the load bank can be decoupled from the additional power busway. At 816, the secondary power distribution system can be electrically decoupled from the additional power busway. At 818, the busway disconnect switch coupled to the additional power busway is closed, so that the additional power busway is electrically coupled to the installed primary power distribution system and carries electrical power supplied by the primary power distribution system. Electrical loads can be installed in the additional space in which the additional power busways is installed, where such installation includes electrically coupling the electrical loads to the additional power busway, such that the electrical loads can receive electrical power support from the installed primary power distribution system via the additional power busway.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for commissioning a power distribution infrastructure in a data center, wherein the method comprises:
    installing a power distribution system in the data center, where the power distribution system comprises a set of power distribution components configured to supply electrical power from at least one of a utility power feed or a generator power feed;
    installing a set of busway disconnect switches in the data center, where the installing comprises electrically coupling the busway disconnect switches in parallel to a downstream end of the power distribution system;
    installing a set of busway stub segments in the data center, where the installing comprises coupling the separate busway stub segments to separate busway disconnect switches;
    verifying that the power distribution system is configured to support electrical power consumption by a plurality of sets of rack computer systems, wherein the verifying comprises:
        electrically coupling a load bank, wherein the load bank is configured to simulate electrical power consumption by a set of rack computer systems, to a particular busway stub segment of the set of busway stub segments; and
        operating the load bank, such that electrical power support of electrical power consumption by the set of rack computer systems by the power distribution system is simulated;
    installing at least one power busway in at least one portion of the data center, wherein the installing comprises:
        electrically isolating the particular busway stub segment from the power distribution system, via operation of a busway disconnect switch coupled to the particular busway stub segment; and
        coupling at least one additional busway segment to the particular busway stub segment, such that the at least one power busway comprises, at a proximate end, the particular busway stub segment and, at a distal end, the at least one additional busway segment; and
    verifying that the at least one power busway is configured to support electrical power consumption by the set of rack computer systems, wherein the verifying comprises:
        electrically coupling at least one load bank, to the proximate end of the at least one power busway;
        electrically coupling a secondary power distribution system to the distal end of the at least one power busway; and
        operating the at least one load bank, such that electrical power support of electrical power consumption by the set of rack computer systems through an entire length of the at least one power busway is simulated; and
    installing the set of rack computer systems in the data center, wherein the installing comprises:
        electrically decoupling the at least one power busway from the at least one load bank;
        electrically decoupling the at least one power busway from the secondary power distribution system;
        electrically coupling the set of rack computer systems to the at least one power busway; and
        electrically coupling the at least one power busway to the power distribution system.

2. The method of claim 1, comprising:
    installing at least one additional power busway in the data center and electrically coupling at least one additional set of rack computer systems to the at least one additional power busway, prior to installing the at least one power busway in the data center;
    wherein the verifying that the at least one power busway is configured to support electrical power consumption by at least one additional set of rack computer systems comprises:
        operating the at least one load bank coupled to the proximate end of the at least one power busway concurrently with the at least one additional power busway distributing electrical power received from the power distribution system to the at least one additional set of rack computer systems, such that the at least one additional set of rack computer systems consumes electrical power supplied by the power distribution system concurrently with the at least one power busway, electrically isolated from the power distribution system, being verified as being configured to support electrical power consumption by at least one set of rack computer systems.

3. The method of claim 1, wherein:
    each busway stub segment, of the set of separate busway stub segments, is coupled to a separate busway disconnect switch at an end of a separate aisle space, such that each separate busway stub segment is configured to supply electrical power to rack computer systems installed in the respective separate aisle space.

4. The method of claim 1, wherein:
    the secondary power distribution system is installed in the data center subsequent to verifying that the power distribution system is configured to support electrical power consumption by a plurality of sets of rack computer systems and prior to verifying that the at least one power busway is configured to support electrical power consumption by set of rack computer systems.

5. A method, comprising:
    verifying that a power distribution system in a data center is configured to support electrical power consumption by a plurality of sets of rack computer systems, wherein the verifying comprises:
        electrically coupling a set of busway stub segments in parallel to a downstream end of the power distribution system;
        electrically coupling a load bank to a particular busway stub segment of the set of busway stub segments, wherein the load bank is configured to simulate electrical power consumption by a set of rack computer systems; and operating the load bank, such that electrical power support by the power distribution system, of electrical power consumption by the set of rack computer systems, is simulated;

installing at least one power busway in at least one aisle in the data center, wherein the installing comprises:
electrically isolating the particular busway stub segment, located adjacent to an end of the at least one aisle, from the power distribution system; and
coupling at least one additional busway segment to the particular busway stub segment, such that the at least one power busway comprises, at a proximate end, the particular busway stub segment and, at a distal end, at least one additional busway segment; and verifying that the at least one power busway is configured to support electrical power consumption by the set of rack computer systems, wherein the verifying comprises:
electrically coupling at least one load bank, to the proximate end of the at least one power busway;
electrically coupling a secondary power distribution system to the distal end of the at least one power busway; and
operating the at least one load bank, such that electrical power support of electrical power consumption by the set of rack computer systems, through an entire length of the at least one power busway, is simulated.

6. The method of claim 5, comprising:
installing at least one additional power busway in at least one other aisle in the data center and electrically coupling at least one additional set of rack computer systems to the at least one additional power busway, prior to installing the at least one power busway in the at least one aisle in the data center;
wherein the verifying that the at least one power busway is configured to support electrical power consumption by at least one additional set of rack computer systems comprises:
operating the at least one load bank coupled to the proximate end of the at least one power busway concurrently with the at least one additional power busway distributing electrical power received from the power distribution system to the at least one additional set of rack computer systems, such that the at least one additional set of rack computer systems consumes electrical power supplied by the power distribution system concurrently with the at least one power busway, electrically isolated from the power distribution system, being verified as being configured to support electrical power consumption by at least one set of rack computer systems.

7. The method of claim 5, comprising:
installing the set of rack computer systems in the data center, wherein the installing comprises:
electrically decoupling the at least one power busway from the at least one load bank;
electrically decoupling the at least one power busway from the secondary power distribution system;
electrically coupling the set of rack computer systems to the at least one power busway; and
electrically coupling the at least one power busway to the power distribution system.

8. The method of claim 5, wherein:
electrically coupling a set of busway stub segments in parallel to a downstream end of the power distribution system comprises coupling each separate busway stub segment to a separate busway disconnect switch which is configured to selectively electrically couple the separate busway stub segment with the power distribution system; and
electrically isolating the particular busway stub segment from the power distribution system comprises opening a busway disconnect switch coupled to the particular busway segment.

9. The method of claim 5, wherein:
the secondary power distribution system is installed in the data center subsequent to verifying that the power distribution system is configured to support electrical power consumption by a plurality of sets of rack computer systems and prior to verifying that the at least one power busway is configured to support electrical power consumption by the set of rack computer systems.

10. The method of claim 5, comprising:
installing a plurality of power busways in the data center, wherein the installing comprises:
coupling separate at least one additional busway segments to separate busway stub segments, and
electrically coupling a set of rack computer systems to a particular power busway, of the plurality of power busways, wherein a limited selection of rack computer systems, of the set of rack computer systems, is further electrically coupled to a secondary power distribution system; and
verifying that another power busway, of the plurality of power busways, is configured to support electrical power consumption by at least one other set of rack computer systems, wherein the verifying comprises:
electrically coupling at least one load bank to the other power busway;
switching the limited selection of rack computer systems to receive power from the secondary power distribution system, such that a remainder of rack computer systems, of the set of rack computer systems, remains electrically coupled to the particular power busway; and
operating the at least one load bank, such that the at least one load bank consumes electrical power supplied from the power distribution system via the another power busway, in parallel with electrical power consumption of electrical power supplied from the power distribution system by the remainder of rack computer systems electrically coupled to the particular power busway.

11. The method of claim 5, wherein:
each busway stub segment, of the set of separate busway stub segments, is coupled to a separate busway disconnect switch at an end of a separate aisle space, such that each separate busway stub segment is configured to supply electrical power to rack computer systems installed in the respective separate aisle space.

12. A method, comprising:
verifying that a power busway, coupled to a power distribution system, is configured to support electrical power consumption from a power distribution system by a set of electrical loads, wherein the verifying comprises:
electrically isolating the power busway from the power distribution system;
electrically coupling the power busway, at a particular end, to a secondary power distribution system;
electrically coupling the power busway, at an opposite end from the particular end, to a load bank which is configured to simulate electrical power consumption by the set of electrical loads of the power busway; and operating the load bank, such that electrical power support by the power busway, of electrical power consumption by the set of electrical loads, through an entire length of the power busway, is simulated via secondary power received from the secondary power distribution system;

wherein, concurrently with the verifying, at least one other power busway is electrically coupled to the power distribution system and another set of electrical loads and is supporting electrical power consumption by the another set of electrical loads, such that the power busway is verified while being electrically isolated from the another set of electrical loads.

13. The method of claim 12, wherein:

to be coupled to the power distribution system, the power busway is coupled to a busway disconnect switch which is configured to selectively electrically couple the power busway to the power distribution system;

electrically isolating the power busway from the power distribution system comprises opening the busway disconnect switch;

the opposite end of the power busway comprises a proximate end coupled to the busway disconnect switch; and the particular end of the power busway comprises a distal end relative to the busway disconnect switch.

14. The method of claim 13, comprising:

coupling the power busway to the power distribution system, prior to the verifying, which comprises:

coupling one or more busway segments to a pre-installed busway stub segment which is coupled to the power distribution system, such that the busway stub segment comprises the proximate end of the power busway and at least one of the one or more busway segments comprises the distal end of the power busway.

15. The method of claim 14, wherein:

the power distribution system comprises a set of power distribution components configured to supply electrical power to a plurality of sets of electrical loads;

the busway stub segment is comprised in a set of separate busway stub segments which are each electrically coupled to a downstream side of the power distribution system via separate busway disconnect switches and each configured to supply electrical power to at least one separate set of the plurality of sets of electrical loads; and both the power distribution system and the busway stub segment are, previously to coupling the power busway to the power distribution system, verified as being configured to provide electrical power support to the plurality of sets of electrical loads, wherein the verifying comprises:

electrically coupling separate load banks, wherein each separate load bank is configured to simulate electrical power consumption of a separate set of electrical loads, to a separate busway stub segment of the plurality of busway stub segments, such that each busway stub segment is configured to supply electrical power received from the power distribution system to a separate load bank; and operating each of the separate load banks, such that electrical power consumption of the plurality of sets of electrical loads via the power distribution system, plurality of busway stub segments, and separate busway disconnect switches is simulated and the configuration of the power distribution components of the power distribution system, the busway disconnect switches, and the busway stub segments to provide electrical power support to the plurality of sets of electrical loads is verified.

16. The method of claim 15, comprising:

coupling at least one busway segment, to at least one busway stub segment of the plurality of busway stub segments, to establish at least one power busway coupled to the power distribution system prior to verifying the power distribution system and the busway stub segments;

wherein verifying the power distribution system and the busway stub segments comprises:

electrically coupling at least one load bank to a distal end of the at least one power busway, such that the at least one power busway is configured to supply electrical power, along an entirety of the at least one power busway, to the at least one load bank; and operating the at least one load bank, concurrently with operating each of the separate load banks coupled to one or more of the busway stub segments, such that electrical power consumption of the plurality of sets of electrical loads via the power distribution system, plurality of busway stub segments, and separate busway disconnect switches is simulated and the configuration of the power distribution components of the power distribution system, the busway disconnect switches, and the busway stub segments to provide electrical power support to the plurality of sets of electrical loads is verified.

17. The method of claim 14, wherein:

each busway stub segment, of the set of separate busway stub segments, is coupled to a separate busway disconnect switch at an end, of a separate aisle space, such that each separate busway stub segment is configured to supply electrical power to electrical loads installed in the respective separate aisle space.

18. The method of claim 12, wherein the verifying further comprises:

subsequently to operating the load bank, installing set of electrical loads, wherein the installing comprises:

electrically decoupling the power busway from the load bank;

electrically decoupling the power busway from the secondary power distribution system;

electrically coupling the set of electrical loads to the power busway; and electrically coupling the power busway to the power distribution system.

* * * * *